(12) United States Patent
Tsukamoto et al.

(10) Patent No.: US 11,126,143 B2
(45) Date of Patent: *Sep. 21, 2021

(54) DECORATIVE ARTICLE AND TIMEPIECE

(71) Applicant: Seiko Epson Corporation, Tokyo (JP)

(72) Inventors: Yuzuru Tsukamoto, Yamagata (JP); Atsushi Kawakami, Matsumoto (JP)

(73) Assignee: Seiko Epson Corporation

( * ) Notice: Subject to any disclaimer, the term of this patent is extended or adjusted under 35 U.S.C. 154(b) by 36 days.

This patent is subject to a terminal disclaimer.

(21) Appl. No.: 16/680,706

(22) Filed: Nov. 12, 2019

(65) Prior Publication Data

US 2020/0081402 A1 Mar. 12, 2020

Related U.S. Application Data

(63) Continuation of application No. 15/468,452, filed on Mar. 24, 2017, now Pat. No. 10,520,893.

(30) Foreign Application Priority Data

| Mar. 28, 2016 | (JP) | 2016-063184 |
| Mar. 28, 2016 | (JP) | 2016-063497 |
| Jun. 22, 2016 | (JP) | 2016-123486 |
| Jun. 22, 2016 | (JP) | 2016-123487 |

(51) Int. Cl.
*B32B 9/00* (2006.01)
*G04B 37/22* (2006.01)
(Continued)

(52) U.S. Cl.
CPC ............. *G04B 37/22* (2013.01); *B05D 1/005* (2013.01); *B05D 1/02* (2013.01); *B05D 1/04* (2013.01); *B05D 1/18* (2013.01); *B05D 1/28* (2013.01); *C23C 14/0021* (2013.01); *C23C 14/022* (2013.01); *C23C 14/024* (2013.01); *C23C 14/0635* (2013.01); *C23C 14/32* (2013.01); *C23C 16/50* (2013.01); *C23C 18/1637* (2013.01); *G04B 19/042* (2013.01);
(Continued)

(58) Field of Classification Search
None
See application file for complete search history.

(56) References Cited

U.S. PATENT DOCUMENTS

| 5,075,181 A | 12/1991 | Quinto et al. |
| 5,676,723 A | 10/1997 | Taniguchi et al. |

(Continued)

FOREIGN PATENT DOCUMENTS

| JP | 11-318520 A | 11/1999 |
| JP | 2004-043959 A | 2/2004 |

(Continued)

*Primary Examiner* — Seth Dumbris
(74) *Attorney, Agent, or Firm* — Harness, Dickey & Pierce, P.L.C.

(57) ABSTRACT

An external part of a timepiece has a substrate that includes a base layer and a surface layer, the surface layer including Ti or stainless steel; and a coating disposed on the substrate. The coating includes an outermost layer formed primarily of TiC defining an external surface, and an interior layer formed primarily of TiC positioned between the substrate and the outermost layer. An elastic modulus of the interior layer is greater than the elasticmodulus of the outermost layer.

20 Claims, 11 Drawing Sheets

(51) Int. Cl.
  *C23C 14/00* (2006.01)
  *C23C 14/02* (2006.01)
  *C23C 14/06* (2006.01)
  *C23C 14/32* (2006.01)
  *G04B 19/04* (2006.01)
  *B05D 1/00* (2006.01)
  *B05D 1/02* (2006.01)
  *B05D 1/04* (2006.01)
  *B05D 1/18* (2006.01)
  *B05D 1/28* (2006.01)
  *C23C 16/50* (2006.01)
  *C23C 18/16* (2006.01)
  *G04B 45/00* (2006.01)

(52) U.S. Cl.
  CPC ....... *G04B 37/226* (2013.01); *G04B 45/0076* (2013.01); *Y10T 428/12576* (2015.01)

(56) References Cited

U.S. PATENT DOCUMENTS

| | | |
|---|---|---|
| 5,989,397 A | 11/1999 | Laube et al. |
| 6,284,376 B1 | 9/2001 | Takenouchi et al. |
| 10,520,893 B2 * | 12/2019 | Tsukamoto ............... B05D 1/28 |
| 2004/0093730 A1 * | 5/2004 | Miya .................... G04B 37/221 29/896.41 |
| 2005/0208325 A1 | 9/2005 | Kawakami et al. |
| 2010/0018250 A1 | 1/2010 | Miya et al. |
| 2013/0157043 A1 | 6/2013 | Cao |
| 2013/0171448 A1 | 7/2013 | Takazaki |
| 2014/0044990 A1 | 2/2014 | Tsukamoto et al. |
| 2015/0037554 A1 | 2/2015 | Gao et al. |

FOREIGN PATENT DOCUMENTS

| | | |
|---|---|---|
| JP | 2004-137541 A | 5/2004 |
| JP | 2005-097651 A | 4/2005 |
| JP | 3642427 B1 | 4/2005 |
| JP | 2005-253893 A | 9/2005 |
| JP | 2005-253894 A | 9/2005 |
| JP | 2006-212340 A | 8/2006 |
| JP | 2006-212341 A | 8/2006 |
| JP | 4072950 B2 | 4/2008 |
| JP | 2008-133542 A | 6/2008 |
| JP | 2014-034713 A | 2/2014 |
| WO | WO-2012-039501 A1 | 3/2012 |

* cited by examiner

DECORATIVE ARTICLE AND TIMEPIECE

CROSS-REFERENCE TO RELATED APPLICATIONS

This application is a continuation of U.S. patent application Ser. No. 15/468,452, filed Mar. 24, 2017, which claims priority to Japanese Patent Application Nos. 2016-063184, filed Mar. 28, 2016; 2016-063497, filed Mar. 28, 2016; 2016-123486, filed Jun. 22, 2016; and 2016-123487, filed Jun. 22, 2016. The disclosures of all of the above applications are hereby expressly incorporated by reference herein in their entireties.

BACKGROUND

1. Technical Field

The present invention relates to a decorative article and a timepiece.

2. Related Art

An excellent appearance is required for decorative articles such as external parts of watches and other timepieces. Metals such as platinum and silver have traditionally been used to achieve this appearance.

The hardness of such metals, however, is generally low, decorative articles made from such materials are therefore easily scratched (particularly external timepiece parts and bracelets, for example), and the appearance of such articles deteriorates significantly with extended use.

To solve this problem, technologies such as nitriding, a process of adding nitrogen to the surface of stainless steel or titanium, for example, are used to increase the hardness of the base metal. See, for example, JP-A-H11-318520.

The nitriding process results in roughening the surface, however, and changes the polished appearance. This roughening is particularly noticeable on mirror-finished articles, which become cloudy, rendering such articles unusable as decorative parts.

One effect of the nitriding process is to make decorative articles that have been nitrided more resistant to scratching by relatively weak external forces. However, nitriding does not protect such decorative articles against relatively strong external forces, which can easily produce relatively deep scratches or indentations (such as scratches from being dropped). A problem with decorative articles that have been nitrided is that such indentations are made even more conspicuous as a result of being protected from small scratches.

SUMMARY

An objective of the invention is to provide a decorative article that is not easily scratched, marred, or indented, and makes indentations resulting from the application of relatively strong external force inconspicuous; and to provide a timepiece having such a decorative article.

The foregoing objective is achieved by the invention as described below.

A decorative article according to the invention has a substrate of which at least part of the surface is configured with Ti or stainless steel; and a coating made of primarily TiC and disposed on the substrate. The coating has at least a first region, and a second region disposed on the substrate side of the first region. The elastic modulus of the second region being greater than the elastic modulus of the first region.

This configuration enables providing a decorative article that is highly resistant to indentation, including scratches and dents, and which, when an indentation is made by a relatively strong external force, makes the indentation inconspicuous.

In another aspect of the invention, the C content of the first region is preferably greater than or equal to 45 wt % and less than or equal to 60 wt %.

This configuration increases the hardness of the outside surface of the coating, making indentation by relatively weak external forces difficult, and making it more difficult for defects such as cracks to develop in the coating.

In another aspect of the invention, the C content of the second region is preferably greater than or equal to 35 wt % and less than or equal to 55 wt %.

This configuration increases the hardness of the entire coating, and enhances the self-repairing effect of the second region.

Further preferably in a decorative article according to another aspect of the invention, if the C content of the first region is $X_1$ (wt %), and the C content of the second region is $X_2$ (wt %), $5<=X_1-X_2<=25$.

This configuration increases the hardness of the entire coating, and further enhances the self-repairing effect of the second region.

In a decorative article according to another aspect of the invention, the coating has a region in which the C content changes on a slope through the thickness of the coating.

This configuration enables desirably changing the elastic modulus of the coating through the thickness of the coating. As a result, the self-repairing effect of the complete coating can be improved. Furthermore, if the composition of the coating changes suddenly, defects (intralayer separation) can easily occur where the composition changes. However, by forming a region in which the C content changes on a slope, the occurrence of this problem can be effectively prevented.

In a decorative article according to another aspect of the invention, the coating preferably includes a third region on the side closer to the substrate than the second region, and the elastic modulus of the third region is greater than the elastic modulus of the second region.

This configuration imparts a self-repairing effect to the second region, as well as a self-repairing effect to the third region. As a result, when a relatively strong external force is applied to the decorative article and an indentation is made, the indentation can be made more inconspicuous. Adhesion of the coating to the substrate can also be further improved, and separation of the coating from the substrate can be more effectively prevented.

In a decorative article according to another aspect of the invention, the C content of the third region is preferably greater than or equal to 15 wt % and less than or equal to 35 wt %.

This configuration increases the hardness of the entire coating, and further enhances the self-repairing effect of the third region.

In a decorative article according to another aspect of the invention, if the C content of the second region is $X_2$ (wt %), and the C content of the third region is $X_3$ (wt %), $5<=X_2-X_3<=40$.

By meeting this condition, this configuration increases the hardness of the entire coating while further enhancing the self-repairing effect of the third region.

In a decorative article according to another aspect of the invention, the coating is preferably a laminate having a first layer that is the first region, and a second layer that is the second region.

This configuration enables providing a decorative article that is highly resistant to indentation, including scratches and dents, and which, when an indentation is made by a relatively strong external force, makes the indentation inconspicuous.

In a decorative article according to another aspect of the invention, the average thickness of the first layer is preferably greater than or equal to 0.10 μm and less than or equal to 0.30 μm.

This configuration increases the hardness of the outside surface of the coating, makes it difficult for indentations to be made by relatively weak external forces, and makes it more difficult for defects such as cracks to form in the coating.

In a decorative article according to another aspect of the invention, the average thickness of the second layer is preferably greater than or equal to 0.60 μm and less than or equal to 1.0 μm.

This configuration further enhances the self-repairing effect of the second layer while preventing a loss of hardness in the complete coating.

Further preferably in a decorative article according to another aspect of the invention, the average thickness of the coating is greater than or equal to 1.1 μm and less than or equal to 1.9 μm.

This configuration sufficiently prevents increasing the internal stress of the coating, and when an indentation is made by a relatively strong external force, can make the indentation more inconspicuous. The durability of the decorative article can therefore also be improved.

In a decorative article according to another aspect of the invention, the coating further includes a third layer on the side of the second layer facing the substrate, and the elastic modulus of the third layer is greater than the elastic modulus of the second layer.

This configuration imparts a self-repairing effect to the second layer, as well as a self-repairing effect to the third layer. As a result, when a relatively strong external force is applied to the decorative article and an indentation is made, the indentation can be made more inconspicuous. Adhesion of the coating to the substrate can also be further improved, and separation of the coating from the substrate can be more effectively prevented.

In a decorative article according to another aspect of the invention, the C content of the third layer is greater than or equal to 15 wt % and less than or equal to 35 wt %.

This configuration further increases the hardness of the entire coating while also further enhancing the self-repairing effect of the third layer. Adhesion between the second layer and the third layer, and adhesion between the substrate and the third layer, can also be improved; and delamination between the second layer and third layer, and delamination between the substrate and the third layer, can be effectively prevented. As a result, the durability and reliability of the decorative article can be further improved.

In a decorative article according to another aspect of the invention, if the C content of the second layer is $X_2$ (wt %), and the C content of the third layer is $X_3$ (wt %), $5 <= X_2 - X_3 <= 40$.

This configuration further increases the hardness of the complete coating, while further enhancing the self-repairing effect of the third layer. Adhesion between the second layer and the third layer, and adhesion between the substrate and the third layer, can also be improved; and delamination between the second layer and third layer, and delamination between the substrate and the third layer, can be effectively prevented. As a result, the durability and reliability of the decorative article can be further improved.

In a decorative article according to another aspect of the invention, the average thickness of the third layer is preferably greater than or equal to 0.40 μm and less than or equal to 0.60 μm.

This configuration further increases the hardness of the complete coating, while further enhancing the self-repairing effect of the third layer.

In another aspect of the invention, the decorative article is preferably an external part of a timepiece.

External parts of timepieces such as wristwatches require a good appearance as decorative items, and also require durability as utilitarian parts. The invention enables satisfying both needs. The effect of the invention is therefore even more pronounced when the decorative article is used as an external part of a timepiece.

Another aspect of the invention is a timepiece having a decorative article according to the invention.

This configuration enables providing a timepiece having decorative parts that are highly resistant to indentation, including scratches and dents, and which, when an indentation is made by a relatively strong external force, make the indentation inconspicuous.

Other objects and attainments together with a fuller understanding of the invention will become apparent and appreciated by referring to the following description and claims taken in conjunction with the accompanying drawings.

DESCRIPTION OF EMBODIMENTS

Preferred embodiments of the present invention are described below with reference to the accompanying figures.

Decorative Article

A decorative article according to the invention is described first.

First Embodiment of a Decorative Article

Figure 1:
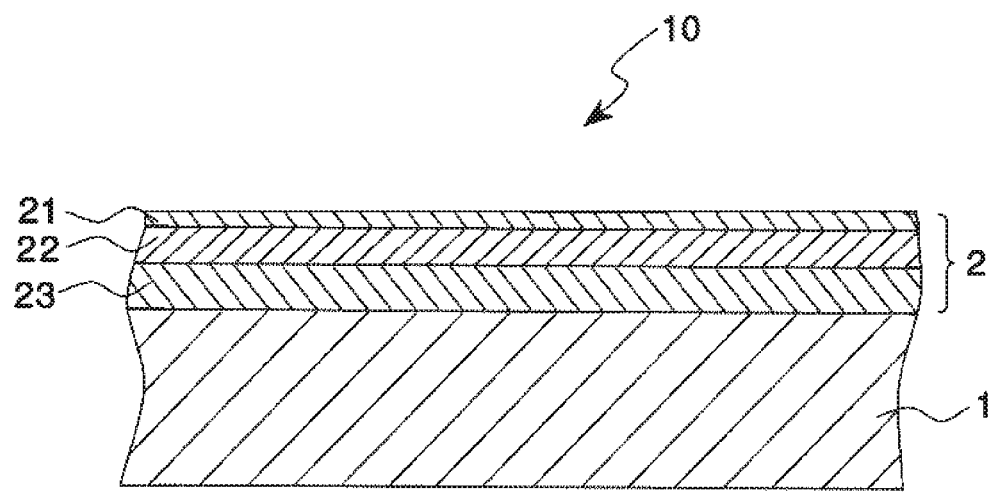
FIG. 1 is a section view of a first embodiment of a decorative article according to the invention.
Figure 2:
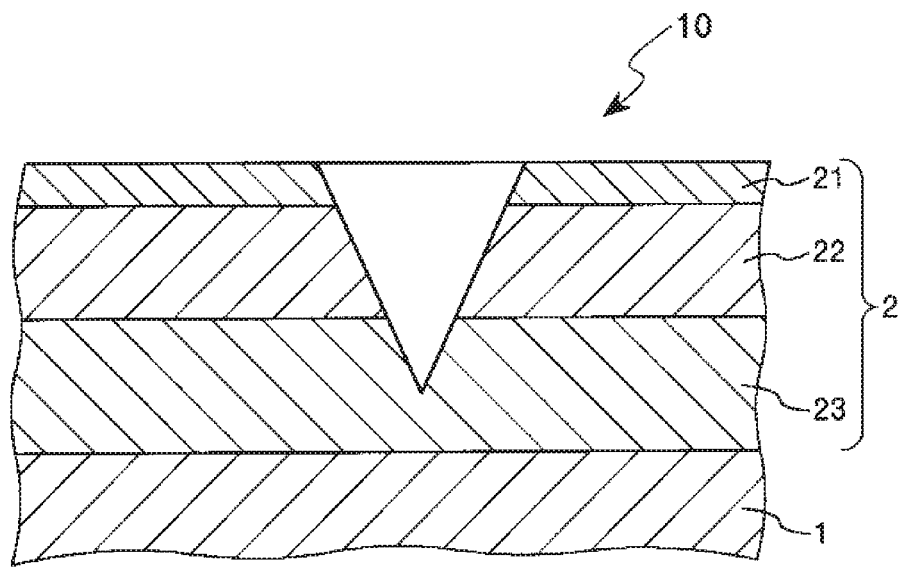
FIG. 2 is a section view schematically illustrating the condition of the decorative article in FIG. 1 immediately after a strong external force is applied.
Figure 3:
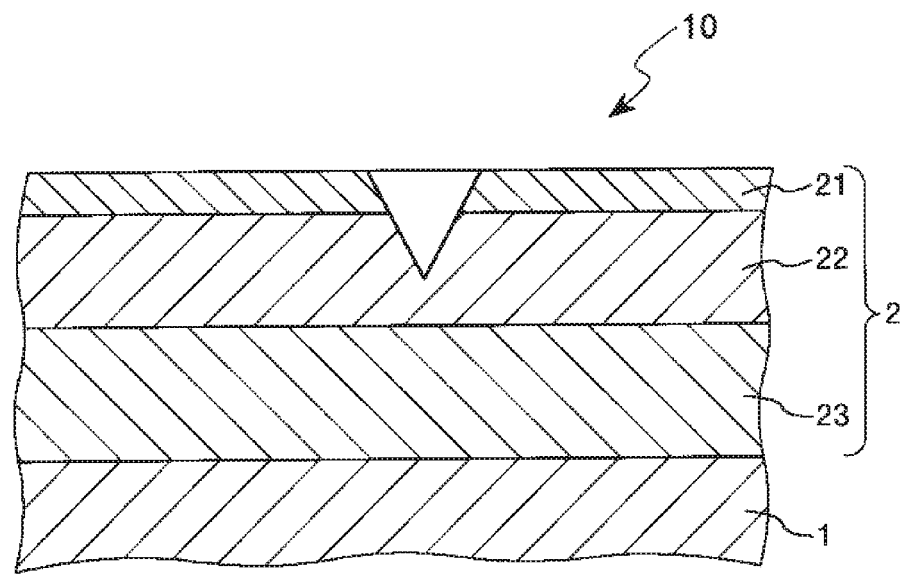
FIG. 3 is a section view schematically illustrating the condition of the decorative article in FIG. 1 a specific time after a strong external force is applied.
Figure 17:
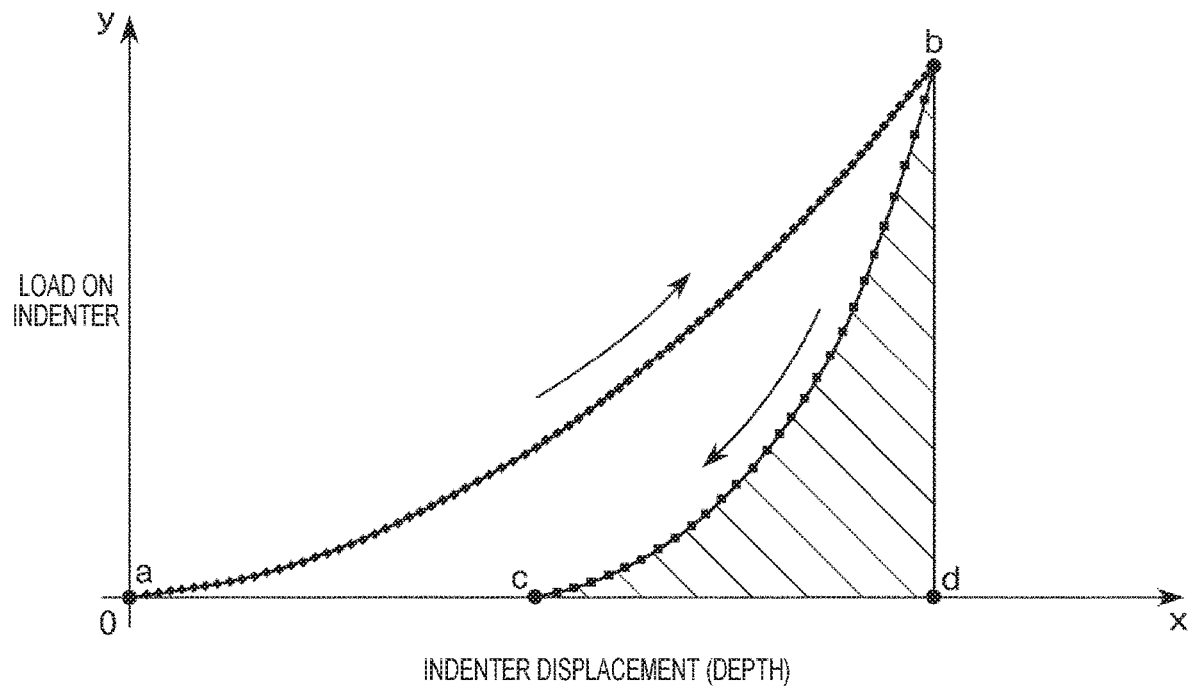
FIG. 17 is a graph used to describe a method of determining elastic deformation work.

FIG. 1 is a section view of a first embodiment of a decorative article according to the invention. FIG. 2 is a section view schematically illustrating the condition of the decorative article in FIG. 1 immediately after a strong external force is applied. FIG. 3 is a section view schematically illustrating the condition of the decorative article in FIG. 1 a specific time after a strong external force is applied. FIG. 17 is a graph used to describe a method of determining elastic deformation work.

A decorative article 10 according to this embodiment has a substrate 1, and a coating 2 of primarily TiC disposed on the substrate 1.

Base

At least part of the surface of the substrate 1 comprises primarily Ti or stainless steel.

Materials comprising primarily Ti include, for example, Ti (pure Ti), and Ti alloys.

Examples of stainless steel include, for example, Fe—Cr alloys, and Fe—Cr—Ni alloys, and more specifically include SUS405, SUS430, SUS434, SUS444, SUS429, SUS430F, SUS304, SUS303, SUS316, SUS316L, SUS316J1, and SUS316J1L.

Note that when materials other than materials comprising primarily Ti, or materials comprising primarily stainless steel are used, sufficiently increasing the hardness of the final decorative article is difficult. When materials comprising primarily Ti, or materials comprising primarily stainless steel are not used, it is also difficult to maintain a beautiful appearance (particularly the appearance required for decorative parts used on the outside of a timepiece) in the final decorative article for a sufficiently long time.

Note further that "primarily" as used herein means that 50 wt % or more of the corresponding part is Ti or stainless steel, further preferably that 70 wt % or more of the corresponding part is Ti or stainless steel, and yet further preferably that 80 wt % or more of the corresponding part is Ti or stainless steel.

The composition of the substrate 1 may be uniform in all parts, or the composition may vary in different parts of the substrate 1. For example, the substrate 1 may have a base layer and a surface layer disposed on the base layer.

By configuring the substrate 1 in this way, the degree of freedom molding the substrate 1 can be increased by the selection of materials forming the base layer. This enables manufacturing a decorative article 10 with a complex shape relatively easy.

When the substrate 1 comprises a base layer and a surface layer, the (average) thickness of the surface layer is not specifically limited but is preferably greater than or equal to 0.1 µm and less than or equal to 50 µm, and further preferably greater than or equal to 1.0 µm and less than or equal to 10 µm.

Furthermore, when the substrate 1 comprises a base layer and a surface layer, materials such as described above can be desirably used as the materials of the surface layer. Metallic and non-metallic materials can also be desirably used as the materials of the base layer.

When the base layer is made with metal, a decorative article 10 with particularly outstanding strength characters can be provided.

Furthermore, when the base layer is metal, even if the surface roughness of the base layer is relatively great, a final decorative article 10 with low surface roughness can be achieved by the leveling effect achieved by forming the surface layer and the coating 2 described below. For example, a mirror finish can be imparted even if mechanical processes such as machining and polishing the surface of the base layer are omitted. A mirror surface can also be easily achieved when the base layer is formed by a MIM process and the surface has a satin finish. This enables achieving a decorative article with outstanding luster.

When the base layer is non-metallic, a decorative article 10 that is relatively lightweight and has a sturdy appearance can be achieved.

When the base layer is configured with a non-metallic material, the base layer can be relatively easily formed to a desired shape.

When the base layer is configured with a non-metallic material, an electromagnetic shielding effect can also be achieved.

Metals that may be used to configure the base layer include, for example, Fe, Cu, Zn, Ni, Ti, Mg, Cr, Mn, Mo, Nb, Al, V, Zr, Sn, Au, Pd, Pt, Ag, and alloys containing at least one of these metals. Of these metals, Cu, Zn, Ni, Ti, Al, or alloys containing at least one of these is particularly desirable.

By configuring the base layer from materials such as described above, excellent adhesion between the base layer and surface layer can be achieved, base layer processing is improved, and the substrate 1 can be molded with greater freedom.

Non-metallic materials that may be used to configure the base layer include ceramics and plastics (particularly thermally stable plastics), stone, and wood.

Examples of ceramic materials include: oxide ceramics such as $A_2O_3$, $SiO_2$, $TiO_2$, $Ti_2O_3$, $ZrO_2$, $Y_2O_3$, barium titanate, and strontium titanate; nitride ceramics such as AlN, $Si_3N_4$, SiN, TiN, BN, ZrN, HfN, VN, TaN, NbN, CrN, and $Cr_2N$; graphite and carbide ceramics such as SiC, ZrC, $Al_4C_3$, $CaC_2$, WC, TiC, HfC, VC, TaC, and NbC; boride ceramics such as $ZrB_2$ and MoB; and compound ceramics combining any two or more such ceramics.

When the base layer is made from such a ceramic, a decorative article 10 with particularly high strength and hardness can be achieved.

Examples of plastics that may be used to configure the base layer include thermoplastic resins and thermosetting resins, such as polyethylene, polypropylene, ethylene-propylene copolymer, ethylene-vinyl acetate copolymer (EVA) and other polyolefins, cyclic polyolefins, denatured polyolefins, polyvinyl chloride, polyvinylidene chloride, polystyrene, polyamide (such as nylon 6, nylon 46, nylon 66, nylon 610, nylon 612, nylon 11, nylon 12, nylon 6-12, nylon 6-66), polyimide, polyamide-imide, polycarbonate (PC), poly-(4-methylbentene-1), ionomer, acrylic resins, polymethylmethacrylate, acrylonitrile-butadiene-styrene copolymer (ABS resin), acrylonitrile-styrene copolymer (AS resin), butadiene-styrene copolymer, polyoxymethylene, polyvinyl alcohol (PVA), ethylene vinyl alcohol copolymer (EVOH), polyethylene terephthalate (PET), polybutylene terephthalate (PBT), polycyclohexane terephthalate (PCT) and other polyesters, polyether, polyether ketone (PEK), polyether ether ketone (PEEK), polyetherimide, polyacetal (POM), polyphenylene oxide, denaturedpolyphenylene oxide, polysulfone, polyethersulfone, polyphenylene sulfide, polyarylate, aromatic polyester (liquid crystal polymer), polytetrafluoroethylene, polyvinylidene fluoride, and other fluororesins, styrenes, polyolefins, polyvinyl chlorides, polyurethanes, polyesters, polyamides, polybutadienes, transpolyisoprenes, fluoroelastomers, polyethylene chlorides and other thermoplastic elastomers, epoxy resin, phenol resin, urea resin, melamine resin, unsaturated polyester, silicon resin, urethane resin, poly-para-xylylene, poly-monochloro-para-xylylene, poly-dichloro-para-xylylene, poly-monofluoro-para-xylylene, poly-monoethyl-para-xylylene, and other poly-para-xylylene resins, as well as copolymers, blends, and polymer alloys of primarily the foregoing, and one or two or more of the foregoing used together (as blended resins, polymer alloys, or laminates, for example).

The shape and size of the substrate 1 are not specifically limited, and are generally determined based on the shape and size of the decorative article 10.

Coating

A coating 2 comprising primarily TiC is disposed to the surface of the substrate 1.

Because TiC is a hard material, the decorative article 10 is made difficult to scratch, mar, or dent by forming a coating 2 comprising such a material.

The thickness of the coating 2 is divided into several regions. More specifically, the coating 2 of a decorative article according to the invention has at least a first region, and a second region that is disposed on the substrate 1 side of the first region (the side closer to the substrate 1) and has an elastic modulus greater than the elastic modulus of the first region.

The first region and second region of the decorative article 10 according to this embodiment are formed in layers. More specifically, the coating 2 in this embodiment has a first layer 21, which is the first region, and a second layer 22, which is the second region and is on the side of the first layer 21 facing the substrate 1.

The elastic modulus of the second layer 22 is greater than the elastic modulus of the first layer 21.

As a result, the outside surface of the coating 2 can be formed with greater hardness, while a self-repairing force works to restore the original shape when a relatively deep indentation is made in the coating 2.

The surface is therefore difficult to scratch, mar, or indent when a relatively weak external force works, and when a relatively strong external force works and produces a deep indentation (see FIG. 2), the indentation becomes smaller (see FIG. 3) and the indentation is made inconspicuous as a result of the self-repairing force. More particularly, not only is the shape of the second layer 22 restored, the size of the hole made in the first layer 21 is also reduced as a result of restoring the shape of the second layer 22, and the indentation is made inconspicuous. As a result, the decorative article 10 can retain an outstanding appearance for a long time.

The elastic modulus of different parts can be obtained using the elastic deformation force (load-displacement curve) acquired by a nanoindentation method, for example.

Note that the elastic modulus and the elastic deformation force are values with different units, but there is a correlation between the elastic modulus and the elastic deformation force, the elastic deformation force decreases as the elastic modulus decreases, and the elastic deformation force increases as the elastic modulus increases.

A method of determining the elastic deformation force from nanoindentation test measurements is described next with reference to FIG. 17.

First, using a nano indenter, the indenter (test tip) is moved into contact with the test site of the test specimen (point a in FIG. 17).

The load applied to the indenter is then increased at a specific rate (curve ab in FIG. 17).

When the load on the indenter reaches a predetermined maximum (point b in FIG. 17), the load on the indenter is reduced at a specific rate (curve bc in FIG. 17).

Measurement stops when the load on the indenter reaches 0 (point c in FIG. 17).

FIG. 17 is a graph of these measurements where y is the load on the indenter, and x is the depth of penetration of the indenter.

Point d in FIG. 17 is the intersection of a line parallel to the Y-axis and passing through the X-axis and point b.

In this example, the coordinates of point a in the graph are (0, 0), the coordinates of point b are (xb, yb), the coordinates of point c are (xc, 0), and the coordinates of point d are (xb, 0).

The area of the region (the shaded area in FIG. 17) between line bc, line cd, and line db is the elastic deformation force at the measurement site of the test specimen.

The elastic deformation force was obtained by preparing a single layer film (a film that is not a laminate and has only one area) under the same conditions and having the same composition as the part of the coating 2 to be measured, and measuring the single-layer film of the test specimen using a nanoindentation method.

The elastic deformation force is obtained by cutting the decorative article 10 through the thickness of the coating 2, and measuring the surface of the section by the nanoindentation method.

To measure the sectional surface of the decorative article 10, the decorative article 10 was cut using an IsoMet 5000 Precision Cutter (Buehler) with a Heiwa Technica A100N cutting wheel turning at 4000 rpm.

To measure the cut surface of the decorative article 10, voids in the cut surface may be filled with resin before measuring.

Unintentional deformation of the layer to be measured in the test (such as separation of part of the layer) can be more reliably prevented, and more accurate nanoindentation test measurements can be taken. Note that if the indenter is set in contact with the composition of the test layer and does not contact the filler resin, the filler resin will not adversely affect the test results.

A SimpliMet 3000 (Buehler) mounting press can be used as the device for filling voids with resin.

The resin filling the voids in the cut surface of the decorative article 10 is preferably a curable resin.

This enables even more reliably preventing unintentional deformation of the layer to be measured in the test (such as separation of part of the layer), and more accurate nanoindentation test measurements can be taken. Polishing such as described below can also be desirably completed.

The cut surface can also be measured after polishing.

As a result, undesirable roughness of the cut surface can be eliminated, and more accurate nanoindentation test measurements can be taken.

Polishing the cut surface is preferably done after filling voids with resin, and, if a curable resin is used as the filler resin, further preferably after curing the curable resin.

This enables more effectively preventing the indenter from contacting the filler resin during testing, and enables more accurate nanoindentation test measurements.

An Ecomet 300 (Buehler) grinder-polisher can be used to polish the cut surface.

Polishing the cut surface can also be done in two or more steps. More specifically, the surface may be first rough polished with a P400 polishing cloth, and then finished with a P1500 polishing cloth.

The elastic deformation force can be measured using various types of nano indenters. For example, the elastic deformation force can be obtained by measurements using an ENT-2100 (Elionix) indenter. A Berkovich No. 5964 indenter may also be used.

The test conditions of the nanoindentation method are not specifically limited, and the following conditions may be used: test temperature, 25° C.; maximum load, 1 mN; loading rate, 2 mN/min; unloading rate, 2 mN/min; maximum load holding time, 0 sec.

First Layer

The first layer 21 is the layer disposed to the outside surface side of the coating 2, and has higher hardness than the second layer 22 described below.

This increases the hardness of the outside surface of the coating 2, and indentation of the coating 2 by relatively weak external forces becomes difficult.

The C (carbon) content of the first layer 21 is also preferably greater than the second layer 22 described below.

The C content of the first layer 21 is preferably greater than or equal to 45 wt % and less than or equal to 60 wt %, and further preferably greater than or equal to 47 wt % and less than or equal to 55 wt %.

As a result, the hardness of the outside surface of the coating 2 is further increased, indentation of the coating 2 by relatively weak external forces becomes difficult, and the coating 2 becomes more resistant to cracks and similar defects.

The average thickness of the first layer 21 is preferably greater than or equal to 0.10 μm and less than or equal to 0.30 μm, and further preferably greater than or equal to 0.12 μm and less than or equal to 0.25 μm.

As a result, the hardness of the outside surface of the coating 2 is yet further increased, indentation of the coating 2 by relatively weak external forces becomes even more difficult, and the coating 2 becomes even more resistant to cracks and similar defects.

The elastic deformation force of the first layer 21 (the elastic deformation force obtained by a nanoindentation method) is not specifically limited, but is preferably greater than or equal to 60 pJ and less than or equal to 120 pJ, and further preferably greater than or equal to 70 pJ and less than or equal to 110 pJ.

As a result, while further increasing the hardness of the outside surface of the coating 2, the self-repairing force can be made even greater when a relatively deep indentation is formed in the coating 2.

Second Layer

The second layer 22 is a layer on the substrate 1 side of the first layer 21, and has a higher elastic modulus (elastic deformation force) than the first layer 21.

In a coating 2 having this second layer 22, a self-repairing force that works to restore the original shape works when a relatively deep indentation (an indentation reaching the second layer 22) is made, and even if a large indentation is made, the indentation is made smaller by the self-repairing force, and the indentation becomes less conspicuous.

The C (carbon) content of the second layer 22 is preferably less than the first layer 21.

As a result, hardness and elastic moduli can be desirably adjusted so that the elastic modulus (elastic deformation force) of the second layer 22 can be made greater than the elastic modulus (elastic deformation force) of the first layer 21 while sufficiently increasing the hardness of the complete coating 2.

The C content of the second layer 22 is preferably greater than or equal to 35 wt % and less than or equal to 55 wt %, and further preferably greater than or equal to 38 wt % and less than or equal to 50 wt %.

This enables further increasing the hardness of the complete coating 2, and further enhancing the self-repairing effect of the second layer 22. Adhesion between the first layer 21 and second layer 22 can also be further increased, and delamination between the first layer 21 and second layer 22, for example, can be more effectively prevented. As a result, the durability and reliability of the decorative article 10 can be further improved.

If the C content of the first layer 21 is $X_1$ (wt %), and the C content of the second layer 22 is $X_2$ (wt %), preferably $5 \leq X_1 - X_2 \leq 25$, and further preferably $8 \leq X_1 - X_2 \leq 22$.

This enables further increasing the hardness of the complete coating 2, and further enhancing the self-repairing effect of the second layer 22. Adhesion between the first layer 21 and second layer 22 can also be further increased, and delamination between the first layer 21 and second layer 22, for example, can be more effectively prevented. As a result, the durability and reliability of the decorative article 10 can be further improved.

The average thickness of the second layer 22 is preferably greater than or equal to 0.60 μm and less than or equal to 1.0 μm, and further preferably greater than or equal to 0.65 μm and less than or equal to 0.95 μm.

As a result, the hardness of the complete coating 2 decreasing can be prevented while the self-repairing effect of the second layer 22 can be further improved.

The elastic deformation force of the second layer 22 (the elastic deformation force obtained by a nanoindentation method) is not specifically limited but is preferably greater than or equal to 120 pJ and less than or equal to 180 pJ, and further preferably is greater than or equal to 130 pJ and less than or equal to 170 pJ.

As a result, the hardness of the complete coating 2 can be further improved while the self-repairing force that works when a relatively deep indentation occurs in the coating 2 can be further enhanced.

Third Layer

In this embodiment of the invention, the coating 2 has a third layer 23 in addition to the first layer 21 and second layer 22 described above. This third layer 23 is formed on the substrate 1 side of the second layer 22 (in the configuration shown in the figure, the layer in contact with the substrate 1), and has a higher elastic modulus (elastic deformation force) than the second layer 22.

This configuration complements the self-repairing effect of the second layer 22 with the self-repairing effect of the third layer 23, and when an indentation is made in the coating 2 by a relatively strong external force, the indentation can be made even less conspicuous. More specifically, when an indentationmade by an external force reaches the third layer 23, the size of the hole made in the second layer 22 and the first layer 21 is also reduced as a result of shape restoration of the third layer 23, and the indentation is made inconspicuous. Adhesion of the coating 2 to the substrate 1 can also be improved, and separation of the coating 2 from the substrate 1 can be more effectively prevented.

The C (carbon) content of the third layer 23 is preferably less than the second layer 22.

As a result, hardness and elastic moduli can be desirably adjusted so that the elastic modulus (elastic deformation force) of the third layer 23 can be made greater than the elastic modulus (elastic deformation force) of the second layer 22 while sufficiently increasing the hardness of the complete coating 2.

The C content of the third layer 23 is preferably greater than or equal to 15 wt % and less than or equal to 35 wt %, and further preferably greater than or equal to 18 wt % and less than or equal to 30 wt %.

This enables further increasing the hardness of the complete coating 2, and further enhancing the self-repairing effect of the third layer 23. Adhesion between the second layer 22 and third layer 23, and adhesion between the substrate 1 and the third layer 23, can also be further increased, and delamination between the second layer 22 and third layer 23, and delamination between the substrate 1 and the third layer 23, for example, can be more effectively prevented. As a result, the durability and reliability of the decorative article 10 can be further improved.

If the C content of the second layer 22 is $X_2$ (wt %), and the C content of the third layer 23 is $X_3$ (wt %), preferably $5 <= X_2 - X_3 <= 40$, further preferably $10 <= X_2 - X_3 <= 35$, and further preferably $15 <= X_2 - X_3 <= 30$.

This enables further increasing the hardness of the complete coating 2, and further enhancing the self-repairing effect of the third layer 23. Adhesion between the second layer 22 and third layer 23, and adhesion between the substrate 1 and the third layer 23, can also be further increased, and delamination between the second layer 22 and third layer 23, and delamination between the substrate 1 and the third layer 23, for example, can be more effectively prevented. As a result, a decorative article 10 with even greater durability and reliability can be provided.

The average thickness of the third layer 23 is preferably greater than or equal to 0.40 μm and less than or equal to 0.60 μm, and further preferably greater than or equal to 0.43 μm and less than or equal to 0.57 μm.

As a result, the hardness of the complete coating 2 decreasing can be prevented while the self-repairing effect of the third layer 23 can be further improved.

The elastic deformation force of the third layer 23 (the elastic deformation force obtained by a nanoindentation method) is not specifically limited but is preferably greater than or equal to 180 pJ and less than or equal to 260 pJ, and further preferably is greater than or equal to 190 pJ and less than or equal to 250 pJ.

As a result, the hardness of the complete coating 2 can be further improved while the self-repairing force that works when a relatively deep indentation occurs in the coating 2 can be further enhanced.

If the elastic moduli of the first layer 21, second layer 22, and third layer 23 are K1, K2, and K3, respectively, K1<K2<K3.

If the elastic deformation force of the first layer 21, second layer 22, and third layer 23 are W1, W2 and W3, W1<W2<W3.

More specifically, if the elastic deformation force of the first layer 21, second layer 22, and third layer 23 are W1, W2 and W3, preferably W1<=0.9 W2<=0.8 W3, and further preferably W1<=0.8 W2<=0.65 W3.

This more clearly differentiates the elastic moduli (elastic deformation forces) of the first layer 21, second layer 22, and third layer 23, and further enhances the effects described above.

The average thickness of the coating 2 is preferably greater than or equal to 1.1 μm and less than or equal to 1.9 μm, and further preferably greater than or equal to 1.2 μm and less than or equal to 1.7 μm.

This configuration sufficiently prevents increasing the internal stress of the coating 2, and when an indentation is made by a relatively strong external force, can make the indentation more inconspicuous. The durability of the decorative article 10 can also be improved.

The decorative article 1 may be any kind of product with decorative qualities, including decorative figurines and other interior design goods and exterior design goods; jewelry; external parts of timepieces; eyeglasses, necktie pins, cuff links, rings, necklaces, bracelets, anklets, broaches, pendants, earrings, pierced earrings, and other personal accessories; lighters and lighter cases, car tire rims, golf clubs and other sporting goods, nameplates, panels, trophy cups, and other types of mechanical parts including housings, and various types of containers and vessels. Of these, the invention is particularly suited to external parts of timepieces.

External parts of timepieces are decorative articles that require an attractive appearance, but are also utilitarian articles that require durability. The invention meets both requirements. The effect of the invention is therefore even more pronounced when the decorative article 10 is used as an external part of a timepiece.

When the decorative article 10 is used as an external part of a timepiece, it may be used as a case member bezel, back cover, watchband (including watch band links, the clasp, and the band-buckle coupling mechanism), the dial, timepiece hands, the crown (such as a screw down crown), buttons, dial rings, and dial covers or spacers, but is preferably in the group of case, bezel, and band-related parts.

These parts contribute greatly to the overall appearance of the timepiece, are easily subject to scratching (particularly abrasion scratches and indentations) from relatively strong external impacts during normal use, and require an excellent appearance together with particularly excellent durability, and when configured according to the invention, meet these requirements. More specifically, the effect of the invention is particularly great when the invention is applied to such external parts of a timepiece.

Note that when the invention is applied to an external part of a timepiece, it may be any part that is visible from the outside when the timepiece is used, and is not limited to parts that are physically exposed on the outside of the timepiece.

Second Embodiment of a Decorative Article

Figure 4:
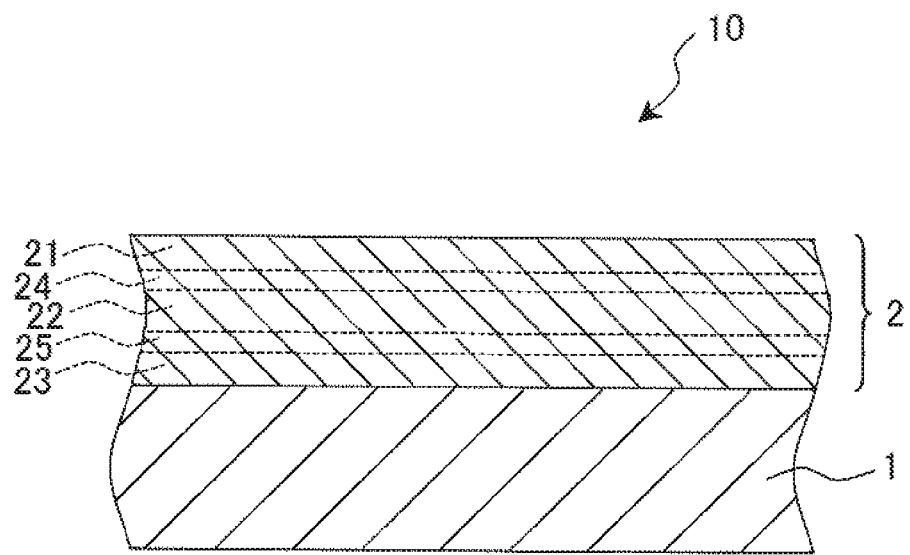
FIG. 4 is a section view of a second embodiment of a decorative article according to the invention.
Figure 5:
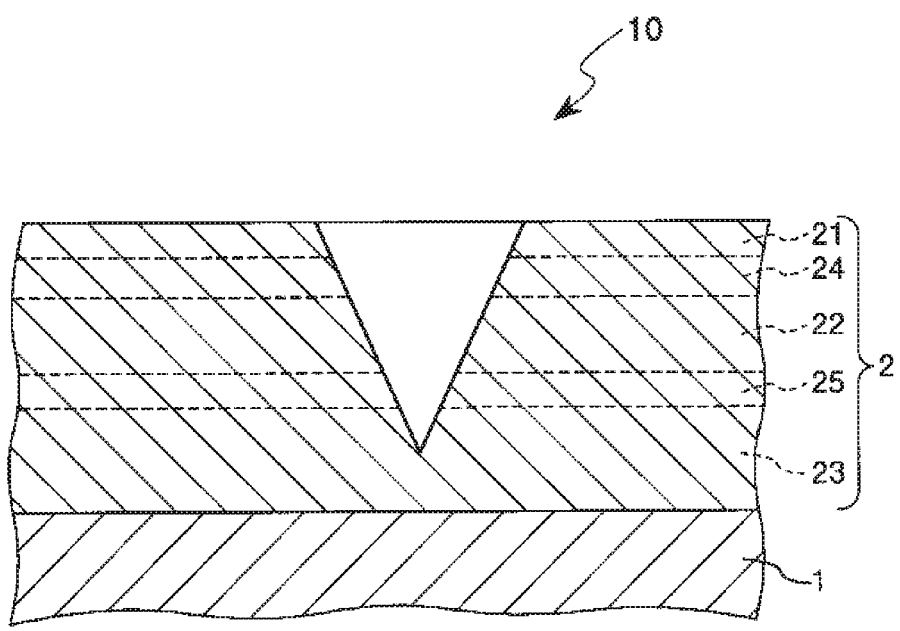
FIG. 5 is a section view schematically illustrating the condition of the decorative article in FIG. 2 immediately after a strong external force is applied.
Figure 6:
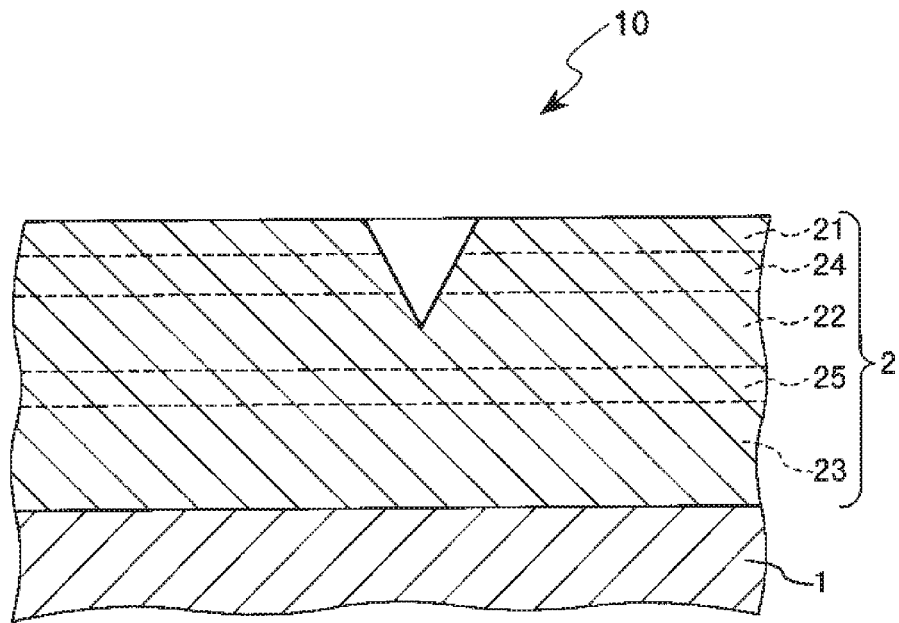
FIG. 6 is a section view schematically illustrating the condition of the decorative article in FIG. 2 a specific time after a strong external force is applied.
Figure 7:
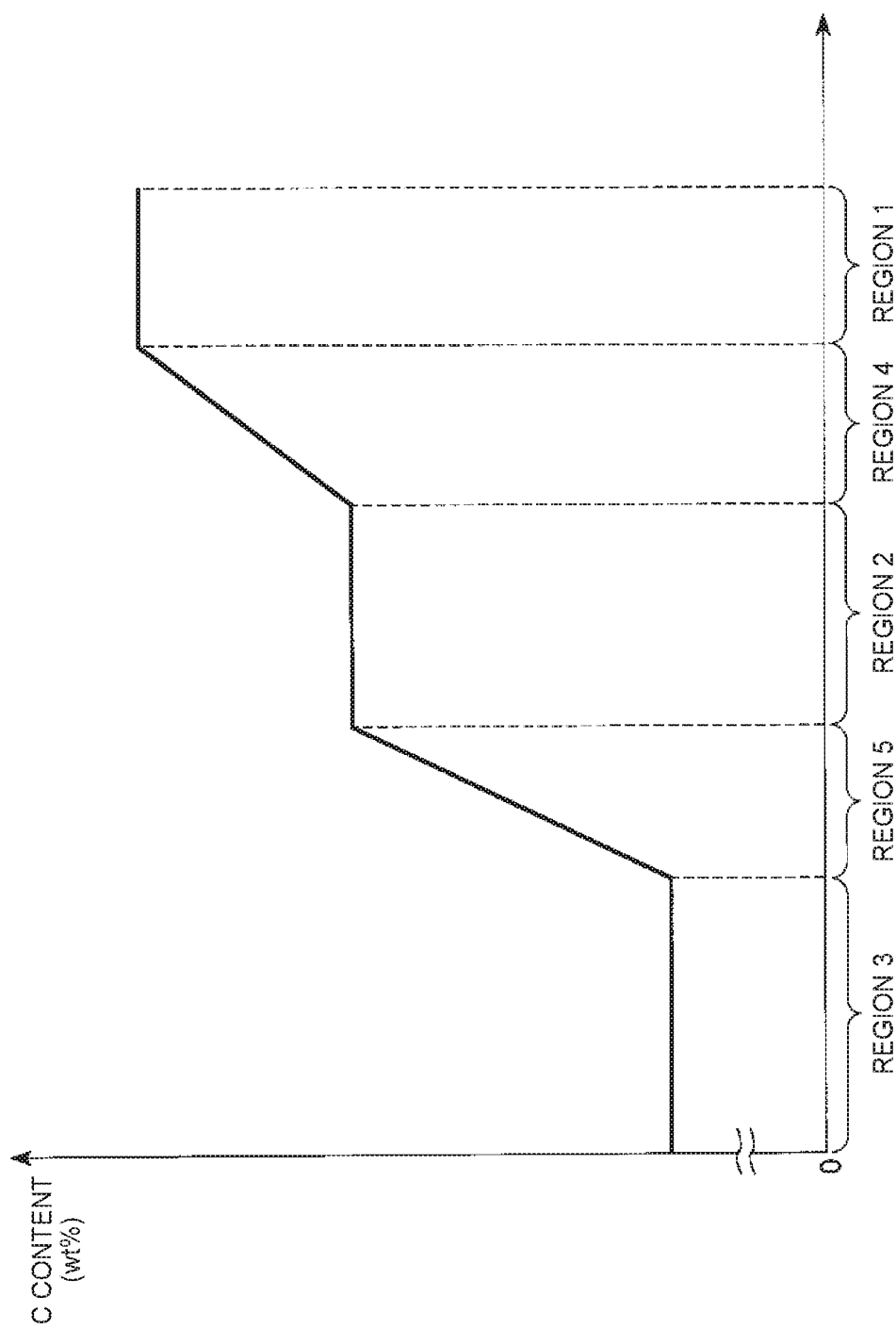
FIG. 7 is a graph showing the distribution of the carbon content at different parts through the thickness of the coating of the decorative article shown in FIG. 4.
Figure 8:
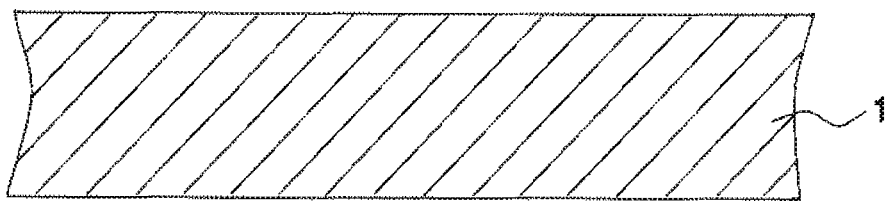
FIG. 8 is a section view illustrating a process (base preparation process) of a first embodiment of a decorative article manufacturing method.
Figure 9:
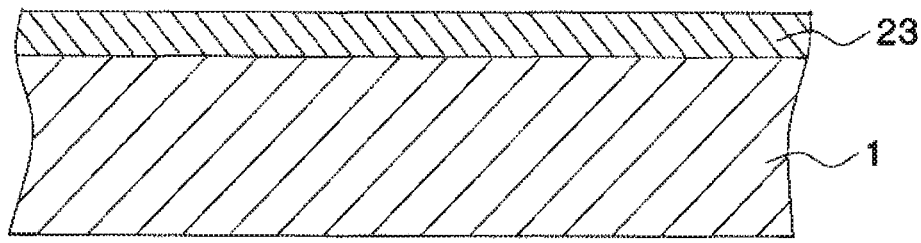
FIG. 9 is a section view illustrating a process (third layer formation process) of a first embodiment of a decorative article manufacturing method.
Figure 10:
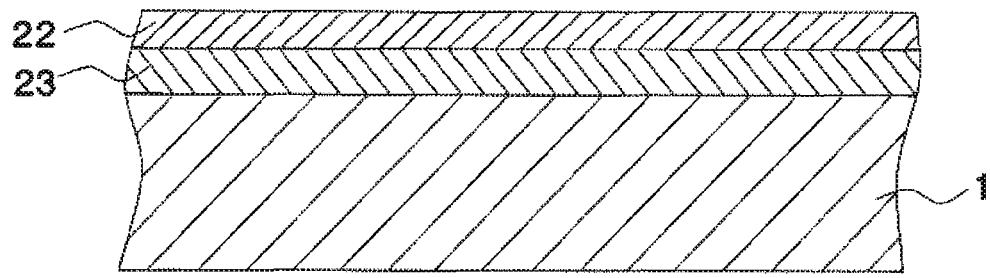
FIG. 10 is a section view illustrating a process (second layer formation process) of a first embodiment of a decorative article manufacturing method.
Figure 11:
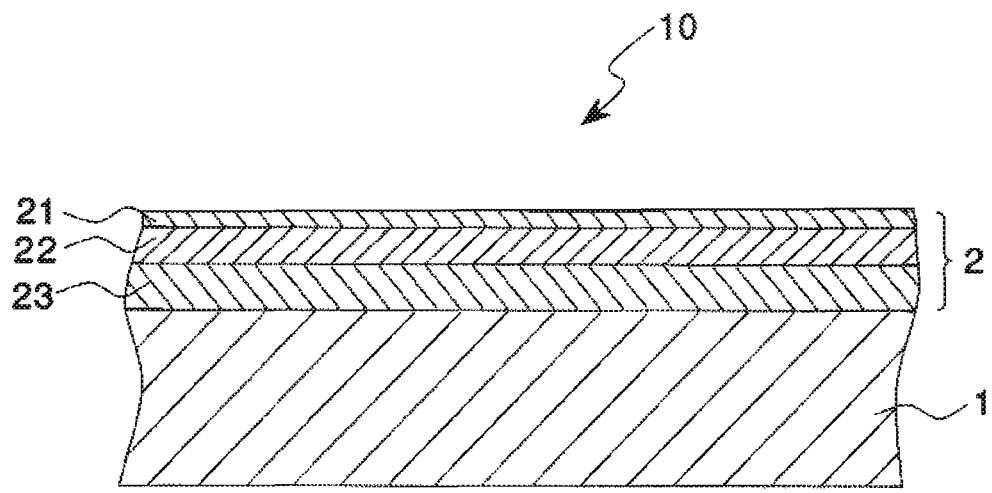
FIG. 11 is a section view illustrating a process (first layer formation process) of a first embodiment of a decorative article manufacturing method.

FIG. 4 is a section view of a second embodiment of a decorative article according to the invention. FIG. 5 is a section view schematically illustrating the condition of the decorative article in FIG. 4 immediately after a strong external force is applied. FIG. 6 is a section view schematically illustrating the condition of the decorative article in FIG. 4 a specific time after a strong external force is applied. FIG. 7 is a graph showing the C content distribution in specific regions through the thickness of the coating on the decorative article shown in FIG. 4. The following description of this embodiment focuses on the differs with the embodiment described above, and further description of identical items is abbreviated or omitted.

A decorative article 10 according to this embodiment is the same as described in the first embodiment except for the differences in the configuration of the coating 2 shown in FIG. 4. The coating 2 of the decorative article 10 according to this embodiment is therefore described below.

Coating

The coating 2 of the decorative article 10 according to this embodiment is configured as a single layer film. More specifically, the coating 2 is configured with a first region 21; a second region 22 on the substrate 1 side of the first region 21, and a third region 23 on the substrate 1 side of the second layer 22.

Note that the first region 21, second region 22 and third region 23 in this embodiment are configured identically to the first layer 21, second layer 22 and third layer 23 of the first embodiment.

Note that in the decorative article 10 according to this embodiment, the average thickness of the first region 21 is preferably greater than or equal to 0.05 μm and less than or equal to 0.28 μm, and further preferably greater than or equal to 0.06 μm and less than or equal to 0.23 μm.

As a result, the hardness of the outside surface of the coating 2 is yet further increased, indentation by relatively weak external forces becomes even more difficult, and the coating 2 becomes even more resistant to cracks and similar defects.

The average thickness of the second region 22 of the decorative article 10 according to this embodiment is preferably greater than or equal to 0.30 μm and less than or equal to 0.95 μm, and further preferably greater than or equal to 0.33 μm and less than or equal to 0.90 μm.

As a result, the hardness of the complete coating 2 decreasing can be prevented while the self-repairing effect of the second region 22 can be further improved.

The average thickness of the third region 23 of the decorative article 10 according to this embodiment is preferably greater than or equal to 0.20 μm and less than or equal to 0.55 μm, and further preferably greater than or equal to 0.22 μm and less than or equal to 0.50 μm.

As a result, the hardness of the complete coating 2 decreasing can be prevented while the self-repairing effect of the third region 23 can be further improved.

If the C content of the first region 21 is $X_1$ (wt %), the C content of the second region 22 is $X_2$ (wt %), and the distance between the first region 21 and the second region 22 through the thickness of the coating 2 (the distance between the center of the thickness of the first region 21 and the center of the thickness of the second region 22) is T (μm), preferably $1 <= (X_1-X_2)/T <= 17$, further preferably $1.2 <= (X_1-X_2)/T <= 12.5$, and yet further preferably $1.25 <= (X_1-X_2)/T <= 10$.

By meeting this condition, the decorative article 10 can be made more resistant to scratching, marring, and other indentation, and when an indentation is made by a relatively strong external force, can make the indentation more inconspicuous.

The coating 2 in this embodiment has regions in which the C content changes on a slope through the thickness. More specifically, between the first region 21 and second region 22 is a fourth region 24 in which the C content changes on a slope with the C content decreasing from the first region 21 to the second region 22. In addition, between the second region 22 and third region 23 is a fifth region 25 in which the C content changes on a slope with the C content decreasing from the second region 22 to the third region 23. See FIG. 7.

By thus forming regions in which the C content changes on a slope, the elastic modulus (elastic deformation force) of the coating 2 can be desirably changed through the thickness of the coating 2. As a result, the self-repairing effect of the coating 2 can be improved. Furthermore, while defects (intralayer separation) can easily occur in the coating 2 if the composition changes suddenly, such problems can be effectively prevented by forming a layer in which the C content changes on a slope.

Method of Manufacturing a Decorative Article

A desirable method of manufacturing a decorative article according to the invention is described below.

Decorative Article Manufacturing Method: Embodiment 1

Figure 12:
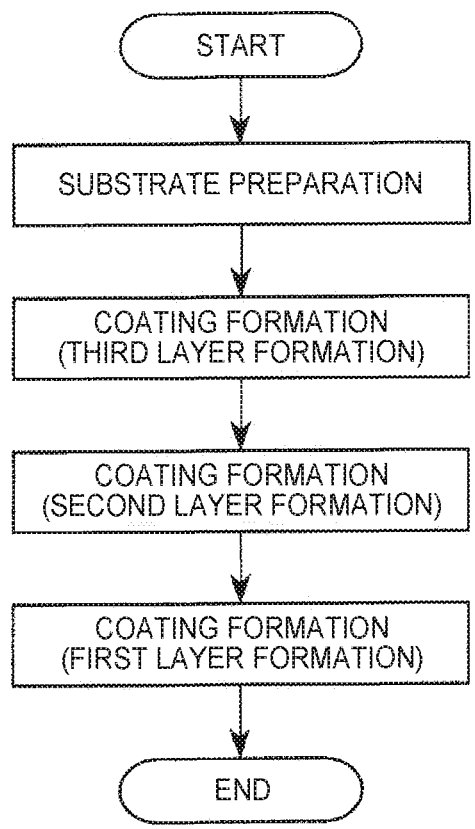
FIG. 12 is a flow chart of the first embodiment of a decorative article manufacturing method.

FIG. 8 to FIG. 11 are section views illustrating steps in a first embodiment of a method of manufacturing a decorative article according to the invention. FIG. 12 is a flow chart of the first embodiment of a method of manufacturing a decorative article.

This embodiment describes a desirable method of manufacturing the decorative article according to the first embodiment of the invention described above.

The manufacturing method of a decorative article 10 according to this embodiment includes a substrate preparation step of preparing the substrate 1 of which at least part of the surface is configured with primarily Ti or stainless steel; and a coating formation step of forming the coating 2 of primarily TiC. The coating formation step includes a third layer formation step of forming the third layer 23 on the surface of the substrate 1; a second layer formation step of forming the second layer 22 on the surface of the third layer 23; and a first layer formation step of forming the first layer 21 on the surface of the second layer 22.

Substrate Preparation Step

The substrate 1 described above is prepared in the substrate preparation step.

The method of manufacturing the substrate 1 is not specifically limited, and the substrate 1 may be formed by such methods as pressing, cutting and grinding, forging, casting, powder metallurgy sintering, metal injection molding (MIM), and lost wax casting.

When the substrate 1 has a base layer and a surface layer as described above, the substrate 1 can be manufactured as described below. That is, the substrate 1 can be acquired by forming the surface layer on a base layer made by an injection molding or extrusion molding process. The surface layer can be formed by coating methods such as dipping, brushing, spraying, electrostatic coating, and electrodeposition coating; wet plating methods such as electrolytic plating, immersion plating, and electroless plating; chemical vapor deposition (CVD) methods such as thermal CVD, plasma CVD, and laser CVD methods; dry plating methods such as vacuum deposition, sputtering, and ion plating; and spray coating methods.

Before the steps described below, the surface of the substrate 1 may also be processed to a mirror, brushed, or satin finish, for example.

Such finishing processes enable varying the luster of the surface of the final decorative article 10, and can further improve the appearance of the final decorative article 10. A mirror finish can be achieved using a known polishing method, including mechanical polishing methods such as buffing and barreling.

Compared with decorative articles produced by direct surface finishing of the coating 2, decorative articles 10 produced with the coating 2 added to a substrate 1 that was surface finished have less glare in the coating 2, and therefore a superior appearance. Furthermore, when the thickness of the coating 2 is relatively thin as described above, direct surface finishing of the coating 2 can easily result in chipping, peeling, and other defects in the coating 2 during the surface finishing process, and therefore significantly reduce yield in decorative article 10 production. Such problems can be effectively prevented by first surface finishing the substrate 1. Surface processing the substrate 1 can also be done under more mild conditions than surface processing the coating 2.

The substrate 1 may also be cleaned by such processes as blasting, alkaline cleaning, acid cleaning, water washing, organic solvent cleaning, and bombardment cleaning before the coating formation step.

This can improve adhesion between the substrate 1 and coating 2.

Coating Formation Step

The coating formation step forms the coating 2 on the surface of the substrate 1.

The method of forming the coating 2 is not specifically limited and various coating methods, wet plating methods, chemical vapor deposition (CVD) methods, dry plating methods (vapor phase epitaxy), and spray coating methods can be used, but a dry plating method (vapor phase epitaxy) is preferred. Examples of coating methods include spin coating, dipping, brushing, spray coating, electrostatic coating, and electrodeposition coating. Wet plating methods include electrolytic plating, immersion plating, and electroless plating. CVD methods include thermal CVD, plasma CVD, and laser CVD methods. Dry plating methods include vacuum deposition, sputtering, and ion plating.

Using a dry plating method (vapor phase epitaxy) to form the coating 2 enables reliably forming a homogenous coating 2 with uniform film thickness and particularly outstanding adhesion with the substrate 1. The appearance and durability of the resulting decorative article 10 are therefore particularly outstanding.

Furthermore, by using a dry plating method (vapor phase epitaxy) to form the coating 2, deviation in layer thickness can be minimized even when the layers (first layer 21, second layer 22, third layer 23) of the coating 2 to be formed are relatively thin. This therefore also helps improve the reliability of the decorative article 10.

Furthermore, by using a dry plating method (vapor phase epitaxy) to form the coating 2, the C content in the different parts (first layer 21, second layer 22, third layer 23) of the coating 2 can be more reliably controlled.

Of the dry plating method (vapor phase epitaxy) noted above, ion plating is particularly desirable.

Using ion plating to form the coating 2 particularly enhances the effects described above. In other words, by using ion plating to form the coating 2, a homogenous coating 2 with uniform film thickness and particularly outstanding adhesion with the substrate 1 can be more reliably formed. As a result, the appearance and durability of the final decorative article 10 can be further improved.

Furthermore, by using ion plating to form the coating 2, deviation in layer thickness can be further minimized even when the layers (first layer 21, second layer 22, third layer 23) of the coating 2 to be formed are relatively thin.

Furthermore, by using ion plating to form the coating 2, the C content in the different parts (first layer 21, second layer 22, third layer 23) of the coating 2 can be even more reliably controlled.

When a dry plating method such as described above is used, the coating 2 can be formed easily and reliably by using a Ti target and a C (carbon) process environment. A hydrocarbon gas, such as acetylene, can be used as the process gas in this case. The composition (C content) of the formed coating 2 can also be adjusted by, for example, appropriately adjusting the gas supply.

The process gas may also contain an inert gas such as argon.

This enables easily and reliably controlling the C content of the coating 2 to a relatively low level.

Furthermore, if a dry plating method is used in the coating formation step, the processes forming the different layers of the coating 2 (the first layer formation step, second layer formation step, third layer formation step) can be executed consecutively in the same device without removing the substrate 1 from the process chamber by, for example, changing the composition of the process gas (such as the ratio of hydrocarbon gas to inert gas), and the gas pressure (partial pressure), in the vapor phase epitaxy system (inside the chamber).

Note that in the decorative article 10 manufacturing method according to this embodiment, the third layer 23, second layer 22, and first layer 21 are formed in adjacent regions with clear boundaries therebetween. In other words, the third layer 23, second layer 22, and first layer 21 each have a uniform composition, and the coating 2 is formed so that the C content changes discontinuously at the boundaries between the layers (the boundary between the third layer 23 and second layer 22, and the boundary between the second layer 22 and first layer 21).

This type of coating 2 can be formed as described below. First, the third layer 23 is formed on the substrate 1 under specific film formation conditions. Film formation (deposition of TiC on the substrate 1) is then interrupted, the film formation conditions (such as the composition of the process gas when the coating is formed by vapor phase epitaxy) are then changed, and film formation is resumed to form the second layer 22. Film formation is then interrupted again, the film formation conditions changed, film formation resumed again, and the first layer 21 is formed to complete the coating 2.

This process can improve adhesion between the layers of the coating 2, and improves productivity of the decorative article 10.

The manufacturing method described above enables efficiently manufacturing decorative articles 10 that are highly resistant to indentations, including scratching and marring, and which, when an indentation is made by a relatively strong external force, make the indentation inconspicuous.

The method of manufacturing a decorative article 10 is summarized in the flow chart in FIG. 12.

Decorative Article Manufacturing Method: Embodiment 2

Figure 13:
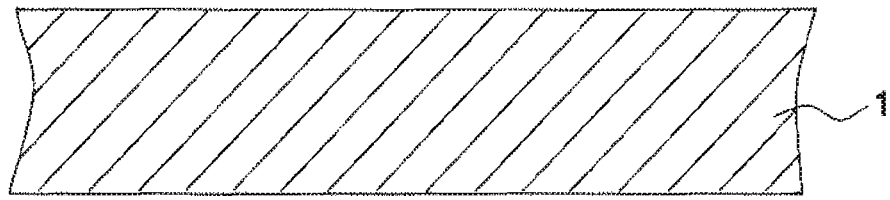
FIG. 13 is a section view illustrating a process (base preparation process) of a second embodiment of a decorative article manufacturing method.
Figure 14:
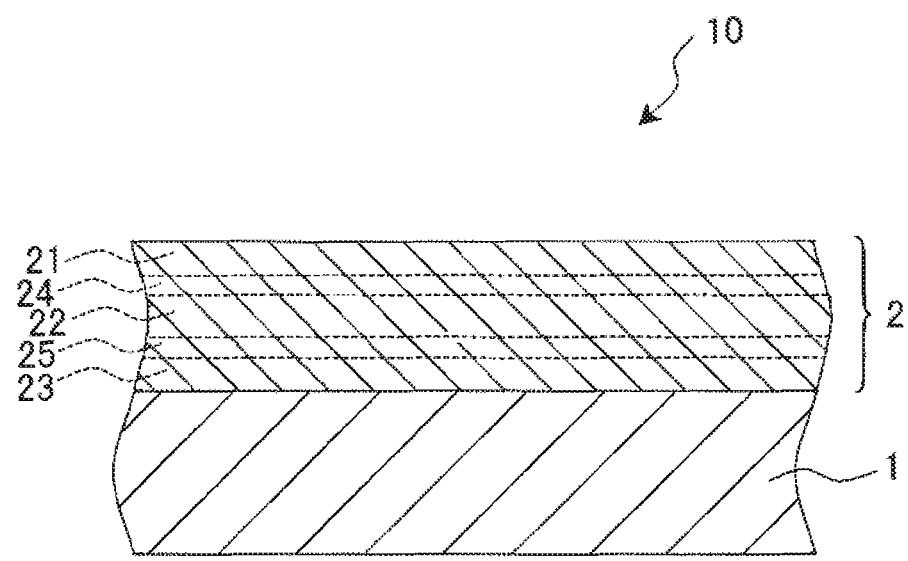
FIG. 14 is a section view illustrating a process (coating formation process) of a second embodiment of a decorative article manufacturing method.
Figure 15:
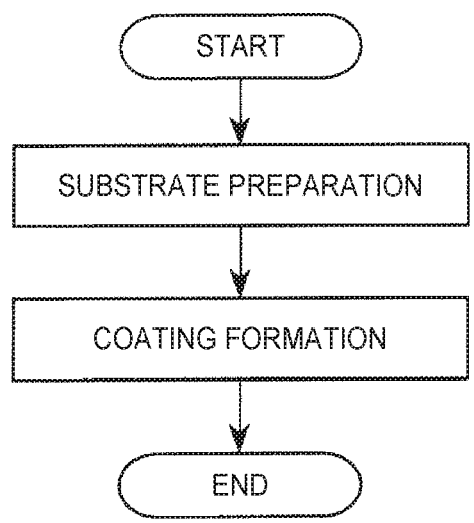
FIG. 15 is a flow chart of the second embodiment of a decorative article manufacturing method.

FIG. 13 and FIG. 14 are section views illustrating steps in a second embodiment of a method of manufacturing a decorative article according to the invention. FIG. 15 is a flow chart of the second embodiment of a method of manufacturing a decorative article. The following description of this embodiment focuses on the differences with the first embodiment of a manufacturing method described above, and further description of like aspects is abbreviated or omitted.

This embodiment describes a desirable method of manufacturing the decorative article according to the second embodiment of the invention described above.

This embodiment of a decorative article 10 manufacturing method is the same as the first embodiment of a decorative article manufacturing method described above except that the film formation step differs. More specifically, this embodiment forms the coating 2 by continuously forming each of the regions described above (first to fifth regions 21, 22, 23, 24, 25).

Instead of interrupting film formation between formation of each layer as described in the above first embodiment of a decorative article manufacturing method, the coating 2 is formed in this method by depositing the layers continuously while adjusting the film formation conditions (such as the composition of the process gas and the gas partial pressure when forming the coating 2 by vapor phase epitaxy).

The manufacturing method of the decorative article 10 according to this embodiment is summarized in the flow chart in FIG. 15.

Timepiece

A timepiece according to the invention is described next.

Figure 16:
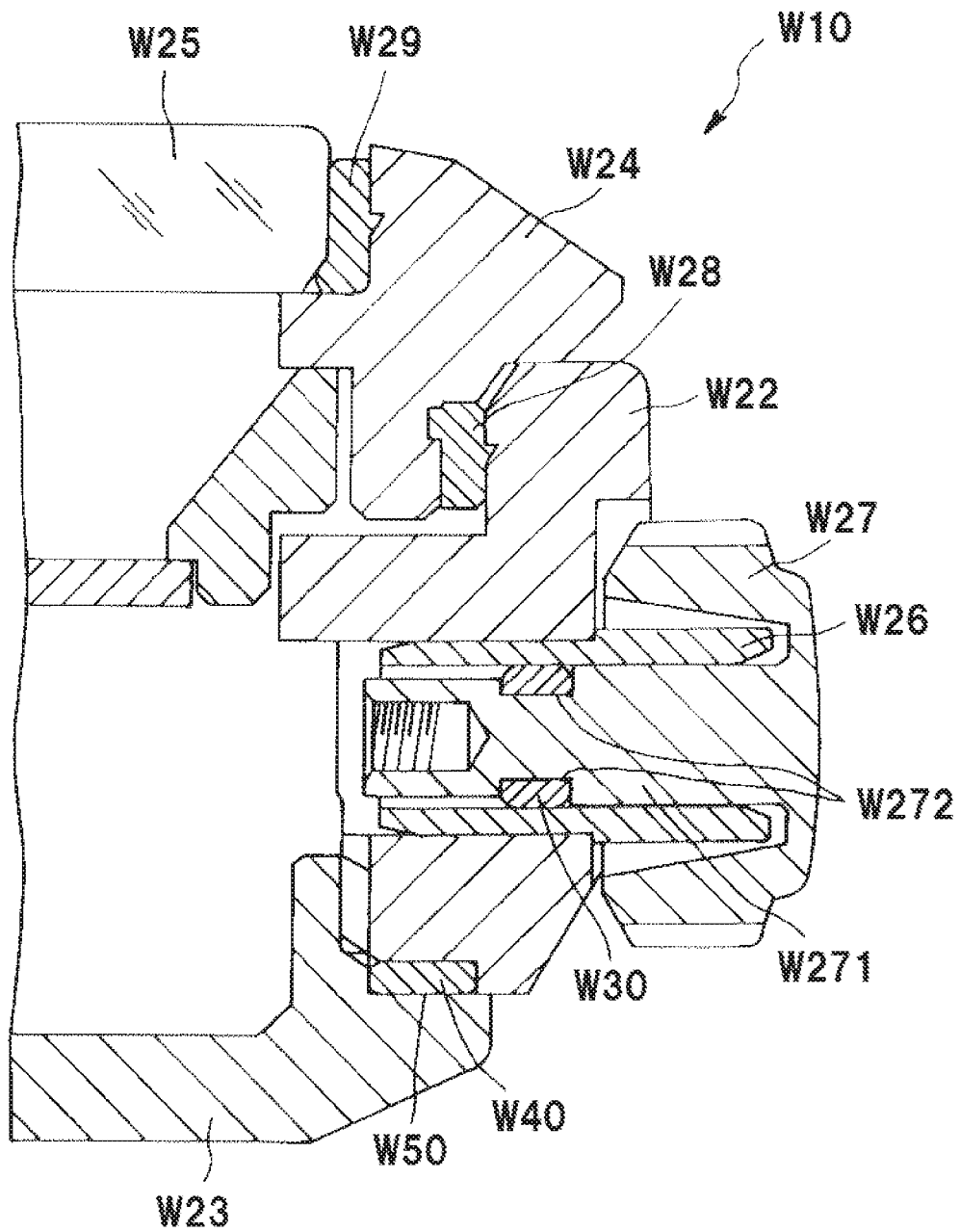
FIG. 16 is a partial section view of a preferred embodiment of a timepiece (wristwatch) according to the invention.

FIG. 16 is a partial section view of a preferred embodiment of a timepiece (wristwatch) according to the invention.

A wristwatch (portable timepiece) W10 according to this embodiment has a case W22, back cover W23, bezel W24, and crystal W25. A movement not shown (such as a dial and an analog movement) is housed inside the case W22.

A stem pipe W26 is inserted and fixed in the case W22, and the stem W271 of the crown W27 is rotatably inserted to the stem pipe W26.

The bezel W24 is fastened to the case W22 by plastic packing W28, and the crystal W25 is secured to the bezel W24 by plastic packing W29.

The back cover W23 is pressed (or screwed) to the case W22 with a ring-shaped rubber packing (back cover packing) W40 compressed in the connection (seal) W50 between the case W22 and back cover W23. This configuration produces a watertight seal at the connection W50, making the wristwatch W10 water resistant.

A channel W272 is formed around the outside circumference in the middle of the stem W271 of the crown W27, and a ring-shaped rubber packing (crown packing) W30 is fit into this channel W272. The rubber packing W30 fits tightly to the inside surface of the stem pipe W26, and is compressed between this inside circumference surface and the inside surface of the channel W272. A watertight seal is thereby created between the crown W27 and the stempipe W26, making the wristwatch W10 water resistant. Note that when the crown W27 is turned, the rubber packing W30 turns with the stem W271 and slides circumferentially against the inside circumference surface of the stem pipe W26.

In the wristwatch W10 in this embodiment of a wristwatch according to the invention, at least one of the decorative articles (particularly external parts of the timepiece) of the wristwatch W10, that is, bezel W24, case W22, crown W27, back cover W23, and the watch band, is a decorative article according to the invention as described above. In other words, a timepiece according to the invention includes a decorative article according to the invention.

As a result, a timepiece having a decorative article that is highly resistant to indentations, including scratching and marring, and which, when an indentation is made by a relatively strong external force, makes the indentation inconspicuous, can be provided.

Preferred embodiments of the invention are described above, but the invention is not limited thereto.

For example, in a decorative article and timepiece according to the invention, the configuration of individual parts can be replaced by desired configurations exhibiting the same function, and other desired configurations can be added.

For example, at least one intermediate layer may be formed between the substrate and the coating.

This can further improve adhesion (adhesion through the intermediate layer) between the substrate and coating.

Furthermore, the foregoing embodiments describe a coating having a first region (first layer), second region (second layer) and third region (third layer), but the invention is not so limited and the coating may have a fourth region (fourth layer) different from the first to third regions (layers).

Multiple coatings as described above may also be formed on the substrate with the multiple coatings having a laminated configuration.

This enables providing a decorative article with particularly outstanding reliability and durability.

A coating (protective layer) imparting corrosion resistance, weather resistance, water resistance, oil resistance, scratch resistance, wear resistance, or resistance to color change can also be formed on at least part of the surface of the decorative article to improve protection against rust, soiling, dulling, and scratching. This protective coating may also be a coating that is removed when the decorative article is used.

In the foregoing embodiments, the third region (third layer) is on the surface of the second region (second layer) facing the substrate, but the third region (third layer) may be disposed between the first region (first layer) and the second region (second layer), for example.

In the second embodiment of a decorative article described above, the first region, second region, and third region forming the coating are described as having a specific composition within each region, but the first region, second region, and third region forming the coating may be configured with internal parts of different compositions (such as changing the C content on a slope through the thickness).

Furthermore, the coating of the decorative article is a coating having at least a first region (first layer) and second region (second layer), and the third region (third layer) may be omitted.

SPECIFIC EXAMPLES

Some specific examples of embodiments of the invention are described next.

Examples of the First Embodiment of a Decorative Article

1. Manufacturing a Decorative Article

Example 1A

A decorative article (wristwatch case) was manufactured by the method described below.

A substrate having the desired shape of the wristwatch case was manufactured by a casting technique using stainless steel (SUS 444), and then ground and polished as required.

This substrate was then cleaned. The substrate was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

As described below, using an ion plating machine as described above, a coating of TiC (average thickness: 1.50 μm) was formed on the substrate cleaned as described above.

While preheating the process chamber of the ion plating machine, the process chamber was vented (depressurized) to $3\times10^{-3}$ Pa.

Argon gas for cleaning was then introduced to the chamber and the workpiece was cleaned for 5 minutes by applying a DC voltage of 350 V.

The process chamber was vented (depressurized) to $2\times10^{-3}$ Pa, acetylene was introduced, and the pressure (total pressure) in the chamber was adjusted to $3.2\times10^{-2}$ Pa. The third layer of TiC was then formed (third layer formation step) by ion plating using a Ti target in this process environment (while continuing to introduce acetylene). The average thickness of the resulting third layer was 0.50 μm. The C content of the third layer was 25.0 wt %.

The second layer was then formed as described below by ion plating the substrate on which the third layer was formed.

After venting (depressurizing) the process chamber to $2\times10^{-3}$ Pa, acetylene was introduced, and the pressure (total pressure) in the chamber was adjusted to $4.0\times10^{-2}$ Pa. The second layer of TiC was then formed (second layer formation step) by ion plating using a Ti target in this process environment (while continuing to introduce acetylene).

The average thickness of the resulting second layer was 0.80 μm. The C content of the second layer was 45.0 wt %.

The first layer was then formed as described below by ion plating the substrate on which the third layer and second layer were formed.

After venting (depressurizing) the process chamber to $2\times10^{-3}$ Pa, acetylene was introduced, and the pressure (total pressure) in the chamber was adjusted to $5.0\times10^{-2}$ Pa. The first layer of TiC was then formed (first layer formation step) by ion plating using a Ti target in this process environment (while continuing to introduce acetylene).

The average thickness of the resulting first layer was 0.20 μm. The C content of the first layer was 50.0 wt %.

The thickness of the first layer, second layer, third layer, and coating was measured by the microscopic cross-sectional test method described in JIS H 5821.

The elastic modulus K1 of the first layer 21, the elastic modulus K2 of the second layer 22, and the elastic modulus K3 of the third layer 23 satisfied the condition that K1<K2<K3.

The layers of the coating (first layer, second layer, third layer) were also formed as single layer films on the surface of a mirror-finished substrate of SUS 304 under the same conditions described above.

The elastic deformation force of each single layer film was then measured using a nanoindentation method.

Measurements were made using an ENT-2100 (Elionix) tester and a No. 5964 Berkovich indenter.

The test conditions of the nanoindentation test method were: test temperature, 25° C.; maximum load, 1 mN; loading rate, 2 mN/min; unloading rate, 2 mN/min; maximum load holding time, 0 sec.

As a result, the elastic deformation force of the first layer was 90 pJ, the elastic deformation force of the second layer was 150 pJ, and the elastic deformation force of the third layer was 220 pJ.

The decorative article manufactured as described above was then cut through the thickness of the coating, and the elastic deformation force of each layer (first layer, second layer, third layer) in the coating was determined from the cut surface using a nanoindentation method.

Measurements on the cut surface were taken after cutting the decorative article, filling voids in the cut surface with a curable resin, curing the curable resin, and then polishing the cut surface in which the curable resin was filled.

The decorative article was cut using an IsoMet 5000 Precision Cutter (Buehler) with a Heiwa Technica A100N cutting wheel turning at 4000 rpm.

Resin was embedded in the cut surface using a SimpliMet 3000 (Buehler) mounting press and a molding time of 4 minutes.

Buehler EpoMet (R) (TiO2 filled epoxy thermoset) was used as the filler resin, and completely cured by UV light.

Using an Ecomet 300 (Buehler) grinder-polisher, the cut surface was rough polished with a P400 polishing cloth, and then finished with a P1500 polishing cloth.

For nanoindentation test measurements, an ENT-2100 (Elionix) indenter with a Berkovich No. 5964 indenter was used.

The test conditions of the nanoindentation test method were: test temperature, 25° C.; maximum load, 1 mN; loading rate, 2 mN/min; unloading rate, 2 mN/min; maximum load holding time, 0 sec.

As in the measurements of the single layer films, the elastic deformation force of the first layer was 90 pJ, the elastic deformation force of the second layer was 150 pJ, and the elastic deformation force of the third layer was 220 pJ.

Examples 2A to 5A

By changing formation conditions of the layers in the coating, decorative articles (wristwatch cases) were manufactured in the same way as in example 1A above except for the configuration of the coating as shown in Table 1.

Example 6A

A decorative article (wristwatch case) was manufactured in the same way as in example 1A above except for making the substrate using Ti instead of stainless steel.

The substrate was manufactured as described below by metal injection molding (MIM).

First, Ti powder with a 52 μm average grain size manufactured by a gas atomization method was prepared.

A material containing 75 vol % of this Ti powder, 8 vol % polyethylene, 7 vol % polypropylene, and 10 vol % paraffin wax was kneaded. A kneader was used to knead this material. The material temperature during kneading was 60° C.

The kneaded material was then ground and graded to obtain pellets with an average grain size of 3 mm. Using these pellets in an injecting molding machine, moldings in the shape of the wristwatch case were manufactured by metal injection molding (MIM). The moldings were made with consideration for shrinkage in the debindering process and during sintering. Molding conditions during injection molding were a 40° C. mold temperature, 80 kgf/cm² injection pressure, 20 second injection time, and 40 second cooling time.

Next, a debindering process was applied to the molding using a degreasing oven to obtain a degreased molding. For the debindering process the molding was left in a $1.0\times10^{-1}$ Pa argon gas atmosphere at 80° C. for 1 hour. The temperature was then raised to 400° C. at 10° C./hour. Sample weight was measured during the heat treatment to find the point at which weight loss ended as the debindering completion point.

The resulting degreased molding was then sintered in a sintering oven to obtain the substrate. Sintering was done by heating in a $1.3 \times 10^{-3}$ to $1.3 \times 10^{-4}$ Pa argon gas atmosphere at 900° C. to 1100° C. for 6 hours.

The substrate thus obtained was then cut and polished as required, and the substrate was then cleaned. The substrate was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

Examples 7A to 10A

By changing formation conditions of the layers in the coating, decorative articles (wristwatch cases) were manufactured in the same way as in example 6A above except for the configuration of the coating as shown in Table 1.

Comparison 1A

A decorative article (wristwatch case) was manufactured by the method described below.

First, a substrate of Ti was made as described in example 6A above.

The substrate was then cleaned. The substrate was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

The decorative article (wristwatch case) was then obtained by applying a carburization process to the cleaned substrate.

Carburizing was done using a plasma carburization process as described below.

A carburization system was prepared by placing a process chamber surrounded by insulation such as graphite fiber insulation in an oven, heating the process chamber using a heating element made of graphite rods, connecting the anode of the DC glow discharge to the top of the process chamber, connecting the cathode to the workpiece stand, and disposing a gas manifold at the required location inside the chamber for appropriately introducing hydrocarbon, nitrogen, argon, hydrogen, or other process gases (including gas for carburization and a dilution gas).

The substrate was then placed in the process chamber of the carburization system and the pressure in the process chamber reduced to 1.3 Pa. The substrate was then heated to approximately 300° C. by a heater while held in the low pressure process chamber.

Argon gas for cleaning was then introduced to the chamber fora 5 minute cleaning process. The cleaning process was done by applying a 350-V DC voltage.

Propane was then introduced to the chamber until the gas composition inside the chamber was substantially 100% propane, the gas pressure was adjusted to 53 Pa, and 400 VDC was applied and held for 120 minutes for plasma carburization. Argon and nitrogen gas were then pressure fed into the chamber to cool the substrate to normal temperature. This carburization process produced a carburized layer approximately 15 μm thick.

Comparison 2A

Except for forming a coating of TiC with a C content of 50.0 wt % and having a uniform composition in each part by changing coating formation conditions, a decorative article (wristwatch case) was manufactured as in example 1A above.

Comparison 3A

Except for forming a coating of TiC with a C content of 45.0 wt % and having a uniform composition in each part by changing coating formation conditions, a decorative article (wristwatch case) was manufactured as in example 1A above.

The configurations of examples 1A to 10A, and comparisons 1A to 3A, are summarized in Table 1. Note that the content of the components shown in Table 1 was at least 99.9 wt % in each part of the decorative article. The single layer films and cut surfaces of the decorative articles were measured by a nanoindentation method under the same conditions as described above for each of the examples and comparisons. As a result, in the single layer films and the cut surfaces of the decorative articles in each of the examples, the elastic deformation force of the first layer was greater than or equal to 70 pJ and less than or equal to 110 pJ, the elastic deformation force of the second layer was greater than or equal to 130 pJ and less than or equal to 170 pJ, and the elastic deformation force of the third layer was greater than or equal to 190 pJ and less than or equal to 250 pJ. In comparison 1A, the elastic deformation force of the carburized layer was 75 pJ.

TABLE 1

| | | | Coating | | | | | |
|---|---|---|---|---|---|---|---|---|
| | | | Layer 1 | | Layer 2 | | Layer 3 | |
| | Substrate Composition | Avg. thickness (μm) | Avg. thickness (μm) | C content (wt %) | Avg. thickness (μm) | C content (wt %) | Avg. thickness (μm) | C content (wt %) |
| Example 1A | SUS444 | 1.50 | 0.20 | 50.0 | 0.80 | 45.0 | 0.50 | 25.0 |
| Example 2A | SUS444 | 1.77 | 0.25 | 47.0 | 0.95 | 38.0 | 0.57 | 18.0 |
| Example 3A | SUS444 | 1.20 | 0.12 | 55.0 | 0.65 | 50.0 | 0.43 | 30.0 |
| Example 4A | SUS444 | 1.50 | 0.30 | 46.0 | 0.60 | 37.0 | 0.60 | 17.0 |
| Example 5A | SUS444 | 1.50 | 0.10 | 56.0 | 1.0 | 51.0 | 0.40 | 31.0 |
| Example 6A | Ti | 1.50 | 0.20 | 50.0 | 0.80 | 45.0 | 0.50 | 25.0 |
| Example 7A | Ti | 1.77 | 0.25 | 47.0 | 0.95 | 38.0 | 0.57 | 18.0 |
| Example 8A | Ti | 1.20 | 0.12 | 55.0 | 0.65 | 50.0 | 0.43 | 30.0 |

TABLE 1-continued

|  | Substrate Composition | Avg. thickness (μm) | Coating | | | | | |
|---|---|---|---|---|---|---|---|---|
|  |  |  | Layer 1 | | Layer 2 | | Layer 3 | |
|  |  |  | Avg. thickness (μm) | C content (wt %) | Avg. thickness (μm) | C content (wt %) | Avg. thickness (μm) | C content (wt %) |
| Example 9A | Ti | 1.50 | 0.30 | 46.0 | 0.60 | 37.0 | 0.60 | 17.0 |
| Example 10A | Ti | 1.50 | 0.10 | 56.0 | 1.0 | 51.0 | 0.40 | 31.0 |
| Comparison 1A | Ti | 15 (carburization) | — | — | — | — | — | — |
| Comparison 2A | SUS444 | 1.50 | 1.50 | 50.0 | — | — | — | — |
| Comparison 3A | SUS444 | 1.50 | — | — | 1.50 | 45.0 | — | — |

2. Evaluation of Appearance

The appearance of the decorative articles manufactured as described in the examples and comparisons above was inspected visually and by microscope, and ranked in four levels as described below.
  A: excellent
  B: good
  C: slightly poor
  D: poor 3. Evaluation of Coating Adhesion Coating adhesion in the decorative articles manufactured in the above examples and comparisons was evaluated using the test described below.

Each decorative article was subjected to the following heat cycle test.

Each decorative article was left at rest for 1.5 hours at 20° C., then 2 hours at 60° C., then 1.5 hours at 20° C., and then 3 hours at −20° C. The ambient temperature was then returned to 20° C. to complete one cycle (8 hours). Each sample was subjected to 3 cycles (24 hours).

The appearance of each sample was then visually inspected and graded according to the four levels described below.
  A: no uplifting or separation of the coating
  B: substantially no uplifting of the coating observed
  C: obvious uplifting of the coating observed
  D: obvious cracking or separation of the coating observed 4. Evaluation of Scratch Resistance The scratch resistance of the decorative articles manufactured in each of the examples and comparisons described above was tested and evaluated as described below.

A stainless steel brush was pushed with a force of 0.2 kgf against the surface of the decorative article on which the coating was formed and moved in one direction and then back 50 times.

The surface of the decorative article was then visually inspected and the appearance graded on the following four levels.
  A: no scratching observed on the surface of the coating
  B: substantially no scratching observed on the surface of the coating
  C: slight scratching observed on the surface of the coating
  D: severe scratching observed on the surface of the coating 5. Evaluation of Dent Resistance (Difficulty of Denting)

The dent resistance of the decorative articles manufactured in each of the examples and comparisons described above was tested and evaluated as described below.

A stainless steel ball (1 cm diameter) was dropped from a height of 50 cm above the decorative article, and the size of the dent in the surface of the decorative article (the diameter of the dent) was measured and graded according to the following four levels.
  A: dent diameter<1 mm, or no dent observed
  B: 1 mm≤dent diameter<2 mm
  C: 2 mm≤dent diameter<3 mm
  D: 3 mm≤dent diameter The results of these tests are shown in Table 2.

TABLE 2

|  | Appearance | Coating adhesion | Scratch resistance | Dent resistance |
|---|---|---|---|---|
| Example 1A | A | A | A | A |
| Example 2A | A | A | A | A |
| Example 3A | A | A | A | A |
| Example 4A | A | A | B | A |
| Example 5A | A | A | A | B |
| Example 6A | A | A | A | A |
| Example 7A | A | A | A | A |
| Example 8A | A | A | A | A |
| Example 9A | A | A | B | A |
| Example 10A | A | A | A | B |
| Comparison 1A | D | A | A | D |
| Comparison 2A | A | C | A | D |
| Comparison 3A | A | B | C | B |

As will be understood from Table 2, decorative articles according to the invention having a coating made of TiC and comprising a first layer and a second layer with a higher elastic modulus (elastic deformation force) than the first layer are particularly resistant to scratching, marring, and other indentations, and if an indentation is made by application of a relatively strong external force, the indentation is inconspicuous. In contrast, satisfactory results were not achieved with the comparison samples.

Wristwatches as shown in FIG. 16 were assembled using the decorative articles manufactured in the examples and the comparisons. When the wristwatches were evaluated in the same way as described above, the same results were acquired.

Examples of the Second Embodiment of a Decorative Article

6. Manufacturing a Decorative Article

Example 1B

A decorative article (wristwatch case) was manufactured by the method described below.

A substrate having the desired shape of the wristwatch case was manufactured by a casting technique using stainless steel (SUS 444), and then ground and polished as required.

This substrate was then cleaned. The substrate was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

As described below, using an ion plating machine as described above, a coating of TiC (average thickness: 1.50 μm) was formed on the substrate cleaned as described above.

While preheating the process chamber of the ion plating machine, the process chamber was vented (depressurized) to $3 \times 10^{-3}$ Pa.

Argon gas for cleaning was then introduced to the chamber and the workpiece was cleaned for 5 minutes by applying a DC voltage of 350 V.

The process chamber was vented (depressurized) to $2 \times 10^{-3}$ Pa, acetylene was introduced at a flow rate of 45 ml/min, and the pressure (total pressure) in the chamber was adjusted to $4.0 \times 10^{-3}$ Pa. Vapor deposition of a film then proceeded for a specific time using a Ti target in this process environment (while continuing to introduce acetylene). The flow rate of acetylene was adjusted so that the amount of acetylene introduced to the process chamber (the amount introduced per unit time) increased over time. When the acetylene flow rate reached 60 ml/min, the flow was adjusted to maintain a constant flow, and vapor deposition continued for a specific time. Next, the flow rate of acetylene was adjusted so that the amount of acetylene introduced to the process chamber (the amount introduced per unit time) increased over time. When the acetylene flow reached 70 ml/min, the flow was adjusted to maintain a constant flow, and vapor deposition continued for a specific time.

As a result, a coating made of TiC and having an average thickness of 1.5 μm was formed. The resulting coating had, from the substrate side, a third region with a substantially uniform composition, a fifth region in which the C content increased on a slope to the outside, a second region with a substantially uniform composition, a fourth region in which the C content increased on a slope to the outside, and a first region with a substantially uniform composition.

The C content of the first region, that is, the region including the outside surface of the coating, was 50.0 wt %. The C content of the second region was 45.0 wt %. The C content of the third region, that is, the region including the surface in contact with the substrate, was 25.0 wt %. Note that the thickness of each film was measured using the microscopic cross-sectional test method described in JIS H 5821.

The elastic modulus K1 of the first region, the elastic modulus K2 of the second region, and the elastic modulus K3 of the third region satisfied the condition that K1<K2<K3.

The first, second, and third regions were also formed as single layer films on the surface of a mirror-finished substrate of SUS 304 under the same conditions as the conditions used to form the first region, second region, and third region of the coating described above.

The elastic deformation force of each single layer film was then measured using a nanoindentation method.

Measurements were made using an ENT-2100 (Elionix) tester and a No. 5964 Berkovich indenter.

The test conditions of the nanoindentation test method were: test temperature, 25° C.; maximum load, 1 mN; loading rate, 2 mN/min; unloading rate, 2 mN/min; maximum load holding time, 0 sec.

As a result, the elastic deformation force of the first region was 90 pJ, the elastic deformation force of the second region was 150 pJ, and the elastic deformation force of the third region was 220 pJ.

The decorative article manufactured as described above was then cut through the thickness of the coating, and the elastic deformation force of each region (first region, second region, third region) in the coating was determined from the cut surface using a nanoindentation method.

Measurements on the cut surface were taken after cutting the decorative article, filling voids in the cut surface with a curable resin, curing the curable resin, and then polishing the cut surface in which the curable resin was filled.

The decorative article was cut using an IsoMet 5000 Precision Cutter (Buehler) with a Heiwa Technica A100N cutting wheel turning at 4000 rpm.

Resin was embedded in the cut surface using a SimpliMet 3000 (Buehler) mounting press and a molding time of 4 minutes.

Buehler EpoMet (R) (TiO2 filled epoxy thermoset) was used as the filler resin, and completely cured by UV light.

Using an Ecomet 300 (Buehler) grinder-polisher, the cut surface was rough polished with a P400 polishing cloth, and then finished with a P1500 polishing cloth.

For nanoindentation test measurements, an ENT-2100 (Elionix) indenter with a Berkovich No. 5964 indenter was used.

The test conditions of the nanoindentation test method were: test temperature, 25° C.; maximum load, 1 mN; loading rate, 2 mN/min; unloading rate, 2 mN/min; maximum load holding time, 0 sec.

As in the measurements of the single layer films, the elastic deformation force of the first region was 90 pJ, the elastic deformation force of the second region was 150 pJ, and the elastic deformation force of the third region was 220 pJ.

Examples 2B to 5B

By changing formation conditions of the regions in the coating, decorative articles (wristwatch cases) were manufactured in the same way as in example 1B above except for the configuration of the coating as shown in Table 3.

Example 6B

A decorative article (wristwatch case) was manufactured in the same way as in example 1B above except for making the substrate using Ti instead of stainless steel.

The substrate was manufactured as described below by metal injection molding (MIM).

First, Ti powder with a 52 μm average grain size manufactured by a gas atomization method was prepared.

A material containing 75 vol % of this Ti powder, 8 vol % polyethylene, 7 vol % polypropylene, and 10 vol % paraffin wax was kneaded. A kneader was used to knead this material. The material temperature during kneading was 60° C.

The kneaded material was then ground and graded to obtain pellets with an average grain size of 3 mm. Using these pellets in an injecting molding machine, moldings in the shape of the wristwatch case were manufactured by metal injection molding (MIM). The moldings were made with consideration for shrinkage in the debindering process and during sintering. Molding conditions during injection molding were a 40° C. mold temperature, 80 kgf/cm² injection pressure, 20 second injection time, and 40 second cooling time.

Next, a debindering process was applied to the molding using a degreasing oven to obtain a degreased molding. For the debindering process the molding was left in a $1.0 \times 10^{-1}$ Pa argon gas atmosphere at 80° C. for 1 hour. The temperature was then raised to 400° C. at 10° C./hour. Sample weight was measured during the heat treatment to find the point at which weight loss ended as the debindering completion point.

The resulting degreased molding was then sintered in a sintering oven to obtain the substrate. Sintering was done by heating in a $1.3 \times 10^{-3}$ to $1.3 \times 10^{-4}$ Pa argon gas atmosphere at 900° C. to 1100° C. for 6 hours.

The substrate thus obtained was then cut and polished as required, and the substrate was then cleaned. The substrate was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

Examples 7B to 10B

By changing formation conditions of the regions in the coating, decorative articles (wristwatch cases) were manufactured in the same way as in example 6B above except for the configuration of the coating as shown in Table 3.

Comparison 1B

A decorative article (wristwatch case) was manufactured by the method described below.

First, a substrate of Ti was made as described in example 6B above.

The substrate was then cleaned. The substrate was cleaned by electrolytic alkaline degreasing for 30 seconds followed by dipping in an alkaline degreasing solution for 30 seconds. Then followed neutralization for 10 seconds, a water wash for 10 seconds, and a demineralized water wash for 10 seconds.

The decorative article (wristwatch case) was then obtained by applying a carburization process to the cleaned substrate.

Carburizing was done using a plasma carburization process as described below.

A carburization system was prepared by placing a process chamber surrounded by insulation such as graphite fiber insulation in an oven, heating the process chamber using a heating element made of graphite rods, connecting the anode of the DC glow discharge to the top of the process chamber, connecting the cathode to the workpiece stand, and disposing a gas manifold at the required location inside the chamber for appropriately introducing hydrocarbon, nitrogen, argon, hydrogen, or other process gases (including gas for carburization and a dilution gas).

The substrate was then placed in the process chamber of the carburization system and the pressure in the process chamber reduced to 1.3 Pa. The substrate was then heated to approximately 300° C. by a heater while held in the low pressure process chamber.

Argon gas for cleaning was then introduced to the chamber for a 5 minute cleaning process. The cleaning process was done by applying a 350-V DC voltage.

Propane was then introduced to the chamber until the gas composition inside the chamber was substantially 100% propane, the gas pressure was adjusted to 53 Pa, and 400 VDC was applied and held for 120 minutes for plasma carburization. Argon and nitrogen gas were then pressure fed into the chamber to cool the substrate to normal temperature. This carburization process produced a carburized layer approximately 15 μm thick.

Comparison 2B

Except for forming a coating of TiC with a C content of 50.0 wt % and having a uniform composition in each part by changing coating formation conditions, a decorative article (wristwatch case) was manufactured as in example 1B above.

Comparison 3B

Except for the coating being made of TiC with a C content of 45.0 wt % and having a uniform composition in each part by changing coating formation conditions, a decorative article (wristwatch case) was manufactured as in example 1B above.

The configurations of examples 1B to 10B, and comparisons 1B to 3B, are summarized in Table 3. Note that the content of the components shown in Table 3 was at least 99.9 wt % in each part of the decorative article. The single layer films and cut surfaces of the decorative articles were measured by a nanoindentation method under the same conditions as described above for each of the examples and comparisons. As a result, in the single layer films and the cut surfaces of the decorative articles in each of the examples, the elastic deformation force of the first region was greater than or equal to 70 pJ and less than or equal to 110 pJ, the elastic deformation force of the second region was greater than or equal to 130 pJ and less than or equal to 170 pJ, and the elastic deformation force of the third region was greater than or equal to 190 pJ and less than or equal to 250 pJ. In comparison 1B, the elastic deformation force of the carburized layer was 75 pJ.

TABLE 3

| | | | Coating | | | | | | |
|---|---|---|---|---|---|---|---|---|---|
| | | | Region 1 | | Region 2 | | Region 3 | | |
| | Substrate Composition | Avg. thickness (μm) | Avg. thickness (μm) | C content (wt %) | Avg. thickness (μm) | C content (wt %) | Avg. thickness (μm) | C content (wt %) | $(X_1 - X_2)/T$ |
| Example 1B | SUS444 | 1.50 | 0.10 | 50.0 | 0.40 | 45.0 | 0.30 | 25.0 | 8.33 |
| Example 2B | SUS444 | 1.70 | 0.23 | 47.0 | 0.33 | 38.0 | 0.50 | 18.0 | 15.00 |
| Example 3B | SUS444 | 1.20 | 0.06 | 55.0 | 0.90 | 50.0 | 0.22 | 30.0 | 10.31 |
| Example 4B | SUS444 | 1.50 | 0.20 | 46.0 | 0.30 | 37.0 | 0.45 | 17.0 | 23.23 |
| Example 5B | SUS444 | 1.70 | 0.05 | 56.0 | 0.85 | 51.0 | 0.20 | 31.0 | 6.90 |
| Example 6B | Ti | 1.50 | 0.10 | 50.0 | 0.40 | 45.0 | 0.30 | 25.0 | 8.33 |
| Example 7B | Ti | 1.70 | 0.23 | 47.0 | 0.33 | 38.0 | 0.50 | 18.0 | 15.00 |

TABLE 3-continued

|  | Substrate Composition | Coating | | | | | | | |
|---|---|---|---|---|---|---|---|---|---|
|  |  | | Region 1 | | Region 2 | | Region 3 | | |
|  |  | Avg. thickness (μm) | Avg. thickness (μm) | C content (wt %) | Avg. thickness (μm) | C content (wt %) | Avg. thickness (μm) | C content (wt %) | $(X_1 - X_2)/T$ |
| Example 8B | Ti | 1.20 | 0.06 | 55.0 | 0.90 | 50.0 | 0.22 | 30.0 | 10.31 |
| Example 9B | Ti | 1.50 | 0.20 | 46.0 | 0.30 | 37.0 | 0.45 | 17.0 | 23.23 |
| Example 10B | Ti | 1.70 | 0.05 | 56.0 | 0.85 | 51.0 | 0.20 | 31.0 | 6.90 |
| Comparison 1B | Ti | 15 (carburization) | — | — | — | — | — | — | — |
| Comparison 2B | SUS444 | 1.50 | 1.50 | 50.0 | — | — | — | — | — |
| Comparison 3B | SUS444 | 1.50 | — | — | 1.50 | 45.0 | — | — | — |

7. Evaluation of Appearance

The appearance of the decorative articles manufactured as described in the examples and comparisons above was inspected visually and by microscope, and ranked in four levels as described below.
A: excellent
B: good
C: slightly poor
D: poor 8. Evaluation of Coating Adhesion Coating adhesion in the decorative articles manufactured in the above examples and comparisons was evaluated using the test described below.

Each decorative article was subjected to the following heat cycle test.

Each decorative article was left at rest for 1.5 hours at 20° C., then 2 hours at 60° C., then 1.5 hours at 20° C., and then 3 hours at −20° C. The ambient temperature was then returned to 20° C. to complete one cycle (8 hours). Each sample was subjected to 3 cycles (24 hours).

The appearance of each sample was then visually inspected and graded according to the four levels described below.
A: no uplifting or separation of the coating
B: substantially no uplifting of the coating observed
C: obvious uplifting of the coating observed
D: obvious cracking or separation of the coating observed 9. Evaluation of Scratch Resistance The scratch resistance of the decorative articles manufactured in each of the examples and comparisons described above was tested and evaluated as described below.

A stainless steel brush was pushed with a force of 0.2 kgf against the surface of the decorative article on which the coating was formed and moved in one direction and then back 50 times.

The surface of the decorative article was then visually inspected and the appearance graded on the following four levels.
A: no scratching observed on the surface of the coating
B: substantially no scratching observed on the surface of the coating
C: slight scratching observed on the surface of the coating
D: severe scratching observed on the surface of the coating 10. Evaluation of Dent Resistance (Difficulty of Denting)

The dent resistance of the decorative articles manufactured in each of the examples and comparisons described above was tested and evaluated as described below.

A stainless steel ball (1 cm diameter) was dropped from a height of 50 cm above the decorative article, and the size of the dent in the surface of the decorative article (the diameter of the dent) was measured and graded according to the following four levels.
A: dent diameter<1 mm, or no dent observed
B: 1 mm≤dent diameter<2 mm
C: 2 mm≤dent diameter<3 mm
D: 3 mm≤dent diameter The results of these tests are shown in Table 4.

TABLE 4

|  | Appearance | Coating adhesion | Scratch resistance | Dent resistance |
|---|---|---|---|---|
| Example 1B | A | A | A | A |
| Example 2B | A | A | A | A |
| Example 3B | A | A | A | A |
| Example 4B | A | A | B | A |
| Example 5B | A | A | A | B |
| Example 6B | A | A | A | A |
| Example 7B | A | A | A | A |
| Example 8B | A | A | A | A |
| Example 9B | A | A | B | A |
| Example 10B | A | A | A | B |
| Comparison 1B | D | A | A | D |
| Comparison 2B | A | C | A | D |
| Comparison 3B | A | B | C | B |

As will be understood from Table 4, decorative articles according to the invention having a coating made of TiC and comprising a first region and a second region with a higher elastic modulus (elastic deformation force) than the first region are particularly resistant to scratching, marring, and other indentations, and if an indentation is made by application of a relatively strong external force, the indentation is inconspicuous. In contrast, satisfactory results were not achieved with the comparison samples.

Wristwatches as shown in FIG. 16 were assembled using the decorative articles manufactured in the examples and the comparisons. When the wristwatches were evaluated in the same way as described above, the same results were acquired.

What is claimed is:
1. An external part of a timepiece, comprising:
a substrate that includes a base layer and a surface layer, the surface layer including Ti or stainless steel; and
a coating disposed on the substrate,
wherein the coating includes an outermost layer formed primarily of TiC defining an external surface, and an interior layer formed primarily of TiC positioned between the substrate and the outermost layer, and an elastic modulus of the interior layer is greater than the elastic modulus of the outermost layer.

2. The external part of a timepiece according to claim 1, wherein:
the base layer includes metal.

3. The external part of a timepiece according to claim 1, wherein:
the base layer includes non-metallic material.

4. The external part of a timepiece according to claim 3, wherein:
the non-metallic material is at least one of ceramics, plastics, stone, and wood.

5. The external part of a timepiece according to claim 1, wherein:
a thickness of the surface layer is greater than or equal to 0.1 μm and less than or equal to 50 μm.

6. The external part of a timepiece according to claim 5, wherein:
the thickness of the surface layer is greater than or equal to 1.0 μm and less than or equal to 10 μm.

7. The external part of a timepiece according to claim 1, wherein:
the C content of the outermost layer is greater than or equal to 45 wt % and less than or equal to 60 wt %.

8. The external part of a timepiece according to claim 1, wherein:
the C content of the interior layer is greater than or equal to 35 wt % and less than or equal to 55 wt %.

9. The external part of a timepiece according to claim 1, wherein:
the C content of the outermost layer is $X_1$ (wt %), the C content of the interior layer is $X_2$ (wt %), and $5<=X_1-X_2<=25$.

10. The external part of a timepiece according to claim 1, wherein:
the coating is formed primarily of TiC, and a C content changes on a slope through a thickness of the coating.

11. The external part of a timepiece according to claim 1, wherein:
the coating further includes another interior layer positioned between the interior layer and the substrate, and the elastic modulus of the another interior layer is greater than the elastic modulus of the interior layer.

12. The external part of a timepiece according to claim 6, wherein:
am another interior layer includes C, and the C content of the another interior layer is greater than or equal to 15 wt % and less than or equal to 35 wt %.

13. The external part of a timepiece according to claim 6, wherein:
an another interior layer includes C, the C content of the interior layer is $X_2$ (wt %), the C content of the another interior layer is $X_3$ (wt %), and $5<=X_2-X_3<=40$.

14. The external part of a timepiece according to claim 1, wherein:
the average thickness of the outermost layer is greater than or equal to 0.10 μm and less than or equal to 0.30 μm.

15. The external part of a timepiece according to claim 1, wherein:
the average thickness of the interior layer is greater than or equal to 0.60 μm and less than or equal to 1.0 μm.

16. The external part of a timepiece according to claim 2, wherein:
the coating further includes another interior layer between the interior layer and the substrate, and
the elastic modulus of the another interior layer is greater than the elastic modulus of the interior layer.

17. The external part of a timepiece according to claim 12, wherein:
the average thickness of the another interior layer is greater than or equal to 0.40 μm and less than or equal to 0.60 μm.

18. The external part of a timepiece according to claim 1, wherein:
the average thickness of the coating is greater than or equal to 1.1 μm and less than or equal to 1.9 μm.

19. The external part of a timepiece according to claim 1, wherein:
the external part is at least one of a bezel, a case, a crown, a back cover, and a watch band.

20. A timepiece comprising the external part according to claim 1.

* * * * *